United States Patent [19]

Ohya et al.

[11] Patent Number: 5,686,172
[45] Date of Patent: Nov. 11, 1997

[54] METAL-FOIL-CLAD COMPOSITE CERAMIC BOARD AND PROCESS FOR THE PRODUCTION THEREOF

[75] Inventors: Kazuyuki Ohya; Norio Sayama, both of Tokyo, Japan

[73] Assignee: Mitsubishi Gas Chemical Company, Inc., Tokyo, Japan

[21] Appl. No.: 563,296

[22] Filed: Nov. 28, 1995

[30] Foreign Application Priority Data

| Nov. 30, 1994 | [JP] | Japan | 6-297216 |
| Dec. 20, 1994 | [JP] | Japan | 6-316809 |
| Apr. 26, 1995 | [JP] | Japan | 7-101940 |
| Jun. 2, 1995 | [JP] | Japan | 7-136416 |

[51] Int. Cl.$^6$ ............. B32B 3/00; B32B 3/26; B32B 3/06; H05K 1/00
[52] U.S. Cl. ............. 428/210; 428/320.2; 428/307.3; 428/337; 428/901; 428/409; 428/940; 361/748; 361/750; 174/250; 174/255; 174/258; 264/61; 156/89; 156/306.3; 156/307; 427/96; 427/294; 427/238
[58] Field of Search ............. 428/901, 210, 428/320.2, 409, 940, 307.3, 337; 264/61; 174/250, 255, 258; 156/89, 306.3, 307.1, 312, 307; 361/748, 750; 427/96, 294, 238, 385.5

[56] References Cited

U.S. PATENT DOCUMENTS

| 4,882,455 | 11/1989 | Sato | 428/209 |
| 5,144,536 | 9/1992 | Tsukada | 174/258 |
| 5,314,740 | 5/1994 | Ishil | 428/209 |

FOREIGN PATENT DOCUMENTS

| 0 196 865 | 10/1986 | European Pat. Off. |
| 0 566 360 | 10/1993 | European Pat. Off. |
| WO92/18213 | 10/1992 | WIPO |

OTHER PUBLICATIONS

IBIDEN Co., Ltd., Patent Abstracts of Japan, vol. 13, No. 307 (E–787) 13 Jul. 1989 JP–A–01 082 689.

Sumitomo Chem. Co., Patent Abstracts of Japan, vol. 15, No. 375 (E–1114) 20 Sep. 1991 JP–A–03 149890.

Sumitomo Chem. Co., Patent Abstracts of Japan, vol. 15, No. 375 (E–1114) 20 Sep. 1991 JP–A–093 149891.

*Primary Examiner*—Cathy F. Lam
*Attorney, Agent, or Firm*—Wenderoth, Lind & Ponack

[57] ABSTRACT

A metal-foil-clad composite ceramic board produced by impregnating by impregnating a sintered substrate (II) of an inorganic continuously porous sintered body (I) having a true porosity of 12 to 50% and an open porosity of at least 10%, with a thermosetting resin (R) under vacuum, to form a resin-impregnated sintered substrate (IIR), stacking a metal foil on the resin-impregnated sintered substrate (IIR) and press-forming the resultant laminate, wherein the stacked metal foil has a 10-point average surface roughness Rz of 10 μm or less, and the resin-impregnated sintered substrate (IIR) and the metal foil have substantially no adhesive layer therebetween or have an adhesive layer having a thickness of 10 μm or less therebetween.

10 Claims, No Drawings

1

METAL-FOIL-CLAD COMPOSITE CERAMIC BOARD AND PROCESS FOR THE PRODUCTION THEREOF

FIELD OF THE INVENTION

The present invention relates to a novel metal-foil-clad ceramic board formed of a layer of a continuously porous ceramic sintered body impregnated with a thermosetting resin and a metal foil which is firmly bonded to the layer of the ceramic sintered body through an adhesive layer in a minimum amount, and a process for the production thereof.

Generally, an inorganic continuously porous sintered body has high heat resistance up to about 1,000° C., while the metal-foil-clad ceramic board of the present invention does not show such high heat resistance. However, the metal-foil-clad ceramic board of the present invention exhibits high heat resistance up to the decomposition temperature of the resin, and has excellent properties such as low heat expansion coefficient and high heat conductivity. Further, the metal-foil-clad ceramic board of the present invention is greatly improved in flexural strength, impact resistance, water resistance and chemical resistance, and is also remarkably improved in processability.

The metal-foil-clad ceramic board of the present invention has the above-described novel physical properties, so that it can be applied to a variety of fields where the excellent properties of ceramic are essential but the use of ceramic is limited due to the difficulty in the processability of ceramic.

PRIOR ART OF THE INVENTION

Ceramic has a low heat expansion coefficient, high heat-spreading propery, high electrically insulating properties and other excellent properties, and these excellent properties are utilized for practically producing printed wiring boards and other products.

Since, however, ceramic is generally poor in processability, the use of ceramic as a desired part, or the like, requires a special device or machine and advanced processing technique for production therefrom. As a result, products from ceramic are very expensive, and the use of ceramic is greatly limited.

For overcoming the above defects, a machinable ceramic having processability with a machine is developed, while this machinability is limited. For example, generally, it is difficult to cut the machinable ceramic to plates having a thickness of about 1 mm and a considerable breadth. Even if obtained, such plates are too fragile to use as they are.

Further, a machinable ceramic is generally a composite ceramic having pores so that it may be machinable. As a result, the machinable ceramic has a defect in that it shows great changes in physical properties due to moisture absorption when used under ordinary environments.

On the other hand, a ceramic multi-layer circuit board is produced by a green sheet method in which green ceramic sheets not calcined are provided, desired printed wiring networks and film-like parts from a paste of a calcining type are formed on the green ceramic sheets, and these sheets are stacked and calcined. This green sheet method has been put to practical use. However, ceramics usable as green sheets are limited in kind. It is essential to carry out the step of heating the green sheets at a high temperature, and it is difficult to precisely control dimensional changes caused by calcination-induced contraction. Further, the above method is inferior in productivity, so that it is not suitable for producing boards such as glass-epoxy laminates which are generally produced in large quantities.

Further, there is another method in which a green ceramic sheet is calcined to prepare a calcined sheet having pores, the calcined sheet is impregnated with a liquid epoxy resin of a two-package type under vacuum, the resin is cured to form a resin ceramic composite substrate, a glass fabric epoxy prepreg prepared by impregnating thin glass fabric with an epoxy resin and a copper foil are placed on each surface of the resin ceramic composite substrate, and the resultant set is press-formed (U.S. Pat. No. 4,882,455, JP-A-64-82689 (=JP-B-3-50429). Moreover, this method is improved by a method in which the above set of a calcined sheet and thin glass fabrics is impregnated with a liquid epoxy resin under vacuum, copper foils are attached with a drawing roll and the resultant set is press-formed (JP-A-64-82689). The latter method has been practically used.

The above method has a certain effect, particularly, on decreasing the heat expansion coefficient. Since, however, one layer of the thin glass fabric is present between one copper foil and the ceramic layer impregnated with a resin and since the other layer of the thin glass fabric is present between the other copper foil and the ceramic layer, the central ceramic layer can have only a small thickness when the board as a whole has a small thickness, so the board is impaired in desired properties, low heat expansion coefficient in particular. Further, the board is also poor in thermal conductivity due to its large adhesive layer, and further has a problem in processability.

Further, JP-A-3-149890 and JP-A-3-149891 disclose a method in which a composition containing a ceramic powder and optional components such as glass short fiber, etc., is compression-molded to prepare a compressed board, the compressed board is impregnated with a liquid epoxy resin of two package type to form a B-staged board, a copper foil is placed thereon and the resultant set is press-formed. Since, however, the so-obtained copper-clad laminate is not from a sintered ceramic, it does not utilize the properties of ceramic or have a heat expansion coefficient of as large as $10 \times 10^{-6} K^{-1}$ to $12 \times 10^{-6} K^{-1}$.

Furthermore, there are also printed circuit boards which are obtained by forming circuit parts and devices on a ceramic substrate to prepare circuit boards, then impregnating the circuit boards with a resin and curing the resin. In these boards, however, circuits and devices are formed at high temperatures to produce ceramic circuit parts and the circuit parts are sealed with a resin for both protection and finishing. Therefore, this technique corresponds to the post-processing in the green sheet method, and has nothing to do with a technique of forming and fixing circuits and devices on a resin-ceramic composite substrate.

As described above, no prior art has a description concerning the technique for producing a metal-foil-clad composite ceramic board in which a ceramic sintered board is impregnated with a resin, a metal foil is directly placed thereon and the resultant set is press-formed.

References cited in the examination of the above U.S. Pat. No. 4,882,455, JP-B-3-50429, etc. are also silent concerning the above technique.

On the other hand, there is also known a method of producing a metal-foil-clad laminate, in which a plurality of B-staged substrates impregnated with a resin such as conventional glass fabric epoxy resin prepregs are stacked, metal foil(s) such as copper foil(s) are further placed thereon and the resultant set is heated and pressed (press-formed).

The resin of the above B-staged substrate impregnated with the resin, used in the above method, has a gelation time of about 2 to 3 minutes under press-forming conditions.

When the B-staging conditions are not proper, e.g., when the gelation time is too long, the resin flows to excess so that the resultant laminate may have a thickness smaller than a predetermined thickness, or the resin flows away to form voids. When the gelation time is too small, the contact between the substrates impregnated with the resin or between the substrate and the metal foil is defective, and the deficiency of the flow of the resin may cause voids.

That is, in conventional methods of producing metal-foil-clad laminates, it is essential to use properly B-staged substrates impregnated with a resin.

It may be conceivable to employ another method in which the above B-staged substrate impregnated with a resin, used in the above method of producing conventional glass epoxy metal-foil-clad laminate, is replaced with a sheet of a B-staged inorganic continuously porous sintered body impregnated with a resin.

The above method corresponds to a method in which the ceramic compressed board in the above method using a ceramic compressed board (JP-A-3-149890 and JP-A-3-149891) is replaced with a ceramic sintered body (sheet of inorganic continuously porous sintered body).

A metal-foil-clad laminate obtained by the above method has a thick adhesive layer between the metal foil and the sheet of the ceramic sintered body. As a result, except for a case where the adhesion between the ceramic and the resin used for the impregnation is excellent and the resin has flexibility, a residual stress based on a difference in heat expansion coefficient is released to cause the copper foil or the adhesive layer to undergo cracking, and the high heat conductivity inherent to ceramic is impaired due to the thick adhesive layer.

It may be conceivable to produce a board having substantially no adhesive layer by devising press-forming conditions.

However, it is very difficult to produce such a board having substantially no adhesive layer for the following reasons. When a large amount of a resin layer is present on a ceramic, the flow pattern of a resin is liable to occur on the copper foil so that the thickness of the adhesive layer varies. Further, high pressure is required for the press-forming, and a very fragile ceramic is therefore liable to undergo cracking. Under the circumstances, so long as the resin layer on the ceramic surface can be removed, an excellent board may be produced. However, due to the fragility of ceramic in particular, it is very difficult to mechanize or automate the operation of removing the resin layer while retaining a proper amount of the resin layer. Further, the proper range of the press-forming conditions based on the amount of the adhesive layer to be removed is very narrow, and there is also a problem in securing the adhesion strength to the metal foil. Furthermore, when the adhesive layer is nonuniformly removed, the nonuniformity is reflected on the surface layer, and the above board having substantially no adhesive layer cannot be produced.

That is, no calcined ceramic board impregnated with a resin can be produced in the same method as that used for producing conventional glass fabric epoxy resin prepregs.

As described above, prior art techniques are not suitable for producing metal-foil-clad composite ceramic boards by impregnating a calcined ceramic board with a resin, directly stacking a metal foil thereon and press-forming the resultant set.

The present inventors diligently made studies to produce a printed wiring board having high dimensional accuracy by utilizing excellent properties of ceramic such as low thermal expansion coefficient, high heat conduction and heat resistance, and as a result, filed applications directed to a method in which an inorganic continuously porous sintered body is impregnated with a thermosetting resin, the thermosetting resin is cured, and the impregnated sintered body is sliced (JP-A-5-291706 and JP-A-6-152086).

A block of a resin-impregnated ceramic used in the above method is greatly improved in processability due to its improvement in impact resistance, etc., so that a large-sized board having a thickness of 1 mm or less, a thickness accuracy of within ±5 μm and a size of 350 mm×250 mm can be produced by slicing. The so-obtained board retains excellent properties of ceramic such as a low thermal expansion coefficient, high heat conduction and heat resistance and has water resistance and chemical resistance.

The above board permits metal plating by any one of conventional dry and wet methods, and can be suitably used as a printed wiring board.

Therefore, the present inventors have made studies of thermosetting resin components used for the impregnation, the surface treatment of porous ceramic layer (inorganic continuously porous sintered body) obtained by impregnating it with the resin and curing the resin, and adhesive compositions, and have developed a metal-foil-clad composite ceramic board in which a metal foil is attached with an adhesive.

The above metal-foil-clad composite ceramic board is excellent in the flatness of the metal foil surface and has impact resistance, machinability, water resistance and chemical resistance. However, its production step is complicated, and the metal foil is attached through an adhesive layer having a thickness of more than 10 μm so that the physical properties of the board are limited depending upon the properties of the adhesive layer. In particular, the problem is that the heat conduction is greatly impaired.

Therefore, the present inventors have made diligent studies to develop a production process for decreasing the adhesive layer such that the adhesive layer is as small as possible. As a result, it has been found that a novel metal-foil-clad composite ceramic board in which a metal foil is strongly bonded through a minimum adhesive layer can be provided by concurrently carrying out the bonding of the metal foil and the production of a resin-impregnated ceramic layer, instead of attaching the metal foil with an adhesive. On the basis of this finding, the present invention has been completed.

SUMMARY OF THE INVENTION

The present invention 1 is a metal-foil-clad composite ceramic board in which a heat-set resin layer forming an adhesive layer for a metal foil is substantially nil or has a thickness of up to 10 μm, i.e., a metal-foil-clad composite ceramic board formed of a resin-impregnated sintered substrate (IIR) obtained by impregnating a 0.2 to 10 mm thick sintered substrate (II) of an inorganic continuously porous sintered body (I) having a true porosity of 12 to 50% and an open porosity of at least 10%, with a thermosetting resin (R) under vacuum, and a metal foil, the resin-impregnated sintered substrate (IIR) and the metal foil being stacked and press-formed, the stacked metal foil having a 10-point average surface roughness $R_z$ of 10 μm or less, the resin-impregnated sintered substrate (IIR) and the metal foil having substantially no adhesive layer therebetween or having an adhesive layer having a thickness of 10 μm or less therebetween.

The present invention 2 is process for the production of the above metal-foil-clad composite ceramic board, i.e., a process for the production of a metal-foil-clad composite ceramic board, which comprises impregnating a 0.2 to 10 mm thick sintered substrate (II) of an inorganic continuously porous sintered body (I) having a true porosity of 12 to 50% and an open porosity of at least 10%, with a thermosetting resin (R) under vacuum to form a resin-impregnated sintered substrate (IIR), placing a metal foil on the resin-impregnated sintered substrate (IIR) to form a set, and press-forming the so-prepared set, the press-forming being carried out by decreasing a pressure in an ambient atmosphere to 20 kPa or less, and then applying a press-forming pressure of at least 0.2 MPa to gel and cure the resin (R).

The present invention 3 is a process for the production of a composite ceramic multi-layer board, i.e., a process for the production of a composite ceramic multi-layer board, which comprises impregnating a sintered substrate (II) of an inorganic continuously porous sintered body (I) having a true porosity of 12 to 50% and an open porosity of at least 10%, with a thermosetting resin (R) under vacuum, curing the thermosetting resin (R) to form a 0.1 to 6 mm thick resin-impregnated sintered substrate (IIR) in which the sintered substrate (II) and the thermosetting resin (R) are integrated, forming a printed wiring network for an inner layer on at least one surface of the resin-impregnated sintered substrate (IIR) to obtain a substrate (PCI), placing a substrate (PI) prepared by impregnating a 0.1 to 3 mm thick sintered substrate (II) with a thermosetting resin (R')on a surface of the substrate (PCI), the surface having the printed wiring network for an inner layer, optionally placing a metal foil for an outer layer on the substrate (PI) to form a set, and press-forming the so-prepared set.

DETAILED DESCRIPTION OF THE INVENTION

The metal-foil-clad ceramic board of the present invention preferably has a thickness accuracy of within ±20 μm, and the metal foil thereof preferably has a 10-point average surface roughness of not more than 5 μm.

The inorganic continuously porous sintered body (I) used in the present invention preferably has an open porosity of at least 10%, preferably 15 to 35%, a true porosity of 12 to 50%, preferably 15 to 45%, a closed porosity of preferably 2% or less, and an average pore diameter of preferably 0.2 to 5μm. Concerning mechanical properties, the inorganic continuously porous sintered body (I) preferably has a Shore hardness (HS) of 45 or less, a Vickers hardness (HV) of 300 or less, and a flexural strength of at least 50 MPa.

The sintered substrate (II) used in the present invention preferably includes the following substrates.

A sintered substrate obtained by sintering a green sheet obtained by an extrusion method to prepare an inorganic continuously porous sintered body (I) and smoothing the surface of the inorganic continuously porous sintered body (I). This sintered substrate has a size, preferably of at least 500 cm$^2$ a thickness of 1.0 to 6.0 mm, and a thickness accuracy of within ±30 μm per a distance of 2 to 50 mm.

A sintered substrate obtained by impregnating a block-like inorganic continuously porous sintered body (I) having a thickness of at least 10 mm with a liquid organic substance (OR) under vacuum, cutting the resultant impregnated sintered body to a predetermined thickness of 0.2 to 6.0 mm, and removing the organic substance (OR) by extraction, gasification or calcination. This sintered substrate preferably has a thickness accuracy of within ±20 μm and a 10-point average surface roughness Rz of 30 μm or less.

The sintered substrate (II) may be that which is treated as follows for imparting it with the following properties.

A sintered substrate obtained by impregnating a sintered substrate (II) with a solution of an organometal compound (OM1), and pyrolyzing the organometal compound (OM1) by heat treatment at a final heating temperature of 650° to 800° C. to form oxide or composite oxide on surfaces including surfaces of pores, so that the sintered substrate (II) has improved affinity to a thermosetting resin (R).

A sintered substrate obtained by impregnating a sintered substrate (II) with an organometal compound (OM2), and pyrolyzing the organometal compound (OM2) by treating the impregnated sintered body with steam and heat-treating it at the highest temperature of 650° to 900° C. to form composite oxide in pores so that it has a high dielectric constant.

The above organometal compound (OM1) is selected from organometal compounds such as Al, Ti and Si compounds. The solution of the organometal compound (OM1) preferably has an organometal compound concentration of 0.05 to 10% by weight.

The above organometal compound (OM2) is selected from organometal compounds such as Ti, Ta, Al, Zr, Ba, Ca, Sr, Pb and Mg compounds. The organometal compound (OM2) is used such that the amount of a product formed therefrom by pyrolysis in pores is 1 to 20% by weight based on the sintered body (I).

The thermosetting resin (R) used in the present invention undergoes curing by addition polymerization and has a melting point higher than room temperature.

The present invention 2 provides a process for the production of a metal-foil-clad composite ceramic board in which a metal foil is placed on a resin-impregnated sintered substrate (IIR) obtained by impregnating the above sintered substrate (II) with a thermosetting resin (R) and the resultant set is press-formed. The press-forming is carried out by heating and pressing the set after a proper reduction degree of the ambient pressure is attained. The production conditions of the present invention 2 are prefrably as follows. a. The thermosetting resin has a melting point higher than room temperature. b. The above reduction of the ambient pressure is initiated before the thermosetting resin (R) is melted. c. The ambient pressure is reduced to 7 KPa or lower, and this ambinent pressure is mantained for at least 5 minutes before the press-forming pressure is applied. d. The press-forming pressure is 0.4 to 4 MPa. e. After the press-forming pressure is applied, the reduction degree of the ambient pressure is decreased (that is, the ambinent pressure is increased) for preventing the gasification of components in the resin (R), and the reduction of the ambient pressure is terminated before the resin (R) starts substantial gelation and curing.

The present invention 3 provides a process for the production of a composite ceramic multi-layer board, which comprises impregnating a sintered substrate (II) of an inorganic continuously porous sintered body (I) having a true porosity of 12 to 50% and an open porosity of at least 10% with a thermosetting resin (R) under vacuum, curing the thermosetting resin (R) to form a 0.1 to 6 mm thick resin-impregnated sintered substrate (IIR) in which the sintered substrate (II) and the thermosetting resin (R) are integrated, forming a printed wiring network for an inner layer on at least one surface of the resin-impregnated sintered substrate (IIR) to obtain a substrate (PCI), placing a substrate (PI) formed of a resin-impregnated sintered substrate (to be sometimes referred to as IIR' hereinafter) prepared by impregnating a 0.1 to 3 mm thick sintered substrate (II) with a thermosetting resin (R') on a surface of the substrate (PCI), the surface having the printed wiring network for an inner layer, optionally placing a metal foil for an outer layer on the substrate (PI) to form a set, and press-forming the so-prepared set.

The conditions of the above invention 3 are as follows. a. The substrate (PCI) and the substrate (PI) use sintered substrates (II) obtained from the same inorganic continuously porous sintered body (I). b. The thermosetting resin R and the thermosetting resin R' are the same in kind. c. The sintered substrate (II) has a thickness accuracy of within ±20 μm per a distance of 2 to 50 mm and a 10-point average surface roughness Rz of 30 μm or less. d. The metal foil of the metal-foil-clad composite ceramic board has a 10-point average surface roughness Rz of 5 μm or less, the heat-cured resin layer forming an adhesive layer for the metal foil is substantially nil, or has a thickness of 10 μm or less, and the substrate (PCI) is formed from the above metal-foil-clad composite ceramic board and has a printed wiring network for an inner layer on at least one surface thereof. e. The substrate (PI) has concave portions sufficiently and fully wide and deep for matching convex portions of the metal foil of the substrate (PCI) including the printed wiring net work for an inner layer.

The constitution of the present invention will be explained hereinafter.

In the metal-foil-clad composite ceramic board of the present invention, the insulating layer (a ceramic layer impregnated with cured resin) has a thickness of 0.2 to 10 mm, and a thickness accuracy of preferably within ±30 μm per a distance of 2 mm to 50 mm, and this thickness accuracy is substantially equivalent to the thickness accuracy of a sintered substrate (II) obtained from an inorganic continuously porous sintered body (I).

Further, in the metal-foil-clad composite ceramic board, the 10-point average surface roughness $R_z$ of the metal foil is 10 μm or less, and the thickness of the heat-cured resin layer forming the adhesive layer for the metal foil is 10 μm or less. Preferably, the adhesive layer is substantially not distinguishable or distinct.

When the metal-foil-clad composite ceramic board has an adhesive layer of the metal foil, the outer surface of the metal foil is highly smooth, and the outer surface of the metal foil has a surface roughness equivalent to the surface roughness of a pressing plate used for the press-forming (generally, surface-polished metal foil or sheet of stainless steel, aluminum or iron) and the surface roughness of the metal foil itself.

On the other hand, when the adhesive layer is not distinguishable, the surface roughness of the metal foil reductively reflects the surface roughness of the sintered substrate (II). Therefore, when the adhesive layer is substantially not distinguishable, and when the 10-point average surface roughness Rz of the laminated metal foil is requried to be 10μm or less, the sintered substrate (II) is generally required to have an Rz of 30 μm or less. In this preferred embodiment, convex portions of uneven surface of the metal foil (the surface laminated on the ceramic surface) contact the ceramic surface and form a structure in which the convex portions penetrate pores of the sintered substrate (II), so that no adhesive layer distinguishable from the resin-impregnated sintered substrate (II) is present.

The metal-foil-clad composite ceramic board of the present invention is remarkably improved in strength and impact resistance when compared with the sintered substrate (II) used as a raw material.

For example, when the sintered substrate (II) has a flexural strength of 50 MPa, generally, the metal-foil-clad composite ceramic board shows a value of at least 70 MPa. Further, when the sintered substrate (II) has a thickness of 1.6 mm and shows a falling ball impact height (measured with an apparatus according to an impact tester of JIS K 6718-1983 for methacrylic resin boards) of approximately 5 to 8 cm, i.e., not sufficient for preparing any good sample for the test, the ceramic layer impregnated with a resin, used in the present invention, is improved and shows a value of 15 to 25 cm, which value is approximately as good as that of a paper phenol-laminated board having a thickness of 1.6 mm for high-temperature punching.

The metal-foil-clad composite ceramic board of the present invention is as machinable as a general glass fiber-reinforced epoxy resin laminate, and in particular, it permits more accurate smaller-diameter drilling than a glass fiber-reinforced epoxy resin laminate.

Further, the low heat expansion coefficient of ceramic is hardly impaired, so that the metal-foil-clad composite ceramic board generally has a heat expansion coefficient almost equivalent to that of the ceramic used. Moreover, after heated at 350° C. for 30 minutes, the metal-foil-clad composite ceramic board is free from distortion and twisting, so that it can be greatly suitably used as a substrate having a low heat expansion coefficient.

Further, the open pores of the sintered substrate (II) are completely filled with a resin, so that the metal-foil-clad composite ceramic board exhibits excellent performance in water absorptivity, acid resistance, alkali resistance, etc. As a result, the formation of a printed wiring network by a wet method, employed for conventional glass-epoxy laminate, can be applied, and a printed wiring board can be produced from the metal-foil-clad composite ceramic board by through hole and etching methods according to conventional methods as required. As described above, the metal foil surface is highly smooth, and the metal-foil-clad composite ceramic board is processable for forming small-diameter holes, so that the metal-foil-clad composite ceramic board is more finely processable than a conventional glass-epoxy laminate.

The components of the metal-foil-clad composite ceramic board of the present invention, the process for the production thereof, and the composite ceramic multi-layer board will be explained hereinafter.

Inorganic continuously porous sintered body (I)

The inorganic continuously porous sintered body used in the present invention is generally produced by incorporating a sintering aid and a mixing aid such as an organic solvent or water into an inorganic powder as required to form a homogeneous mixture, press- or extrusion-molding the mixture to a desired form such as a plate, a prism, a cylinder or others such as a block under high pressure or ultrahigh pressure in a state in which the mixing aid, etc., can be removed as required, further, removing the mixing aid by drying or heating, and sintering the shaped mixture at a temperature of at least 600° C., generally at least 1,000° C.

The inorganic powder as a raw material can be selected from those which can give an inorganic continuously porous sintered body of which the electrical properties, etc., measured in a dry state, are acceptable for electric use, and in the present invention, further, the inorganic powder is selected in view of machinability. The inorganic powder may be a mixture of at least two of the following powders.

Specifically, the inorganic powder includes inorganic powders having a BN content of 8 to 50% by weight, preferably 10 to 40% by weight, such as aluminum nitride-boron nitride composite material (AlN-h-BN), alumina-boron nitride composite material ($Al_2O_3$-h-BN), zirconium oxide-boron nitride composite material ($ZrO_2$-h-BN) and silicon nitride-boron nitride composite material ($Si_3N_4$—BN), wollastonites such as β-wollastonite (β-$CaSiO_3$), cordierite (2MgO/2$Al_2O_3$/5$SiO_2$), and mica. The inorganic continuously porous sintered body is obtained from any one of these powders as a main component. Generally, when the inorganic powder is sintered, a sintering aid is incorporated for improving its sinterability and producing a sintered body having desired machinability.

For example, when AlN-h-BN is used as an inorganic powder, h-BN (hexagonal boron nitride) works as a sintering aid and a pore former, while the sintering aid is selected from oxides of rare earth elements typified by yttria and oxides of alkaline earth elements such as calcia. When β-$CaSiO_3$ is used, there is a practical method of producing a sintered body more improved in heat resistance in the presence of approximately 1 to 18% by weight of MgO.

Generally, for oxide-based ceramic, gel obtained by decomposing an organic metal compound can be used as a sintering aid. For example, in one sintering method, a solution of an organic metal compound and a ceramic powder as a raw material are mixed, the organic metal compound is decomposed, e.g., under heat to form a gel in a uniform dispersion, the gel is shaped under pressure as required, and the shaped body is dried and then sintered at a temperature between 600° C. and 1,000° C. Generally, the inorganic continuously porous sintered body obtained by the above method has low strength, while this sintered body is integrated with a resin in the present invention so that it is greatly improved in strength and impact resistance.

Further, for example, various types of ceramic ware are used for electrically insulating materials such as an insulator and fireproofing materials such as a conventional electric furnace and construction material.

Some of the above ceramic materials can be used as an inorganic continuously porous sintered body (I) having the above-described flexural strength, low hardness, uniformity, a desirable porosity and a desirable pore diameter. Those which can satisfy the electric properties, etc., can be naturally used as an inorganic continuously porous sintered body (I).

In the present invention, it is particularly preferred to use aluminum nitride-boron nitride composite material (AlN-h-BN) which has a hexagonal crystal system or β-wollastonite (β-$CaSiO_3$).

The inorganic continuously porous sintered body (I) of the present invention has a true porosity (vol/vol %), defined below, of 12 to 50%, preferably 15 to 45%. When the true porosity is less than 12%, the sintered body (I) is poor in machinability. When the true porosity exceeds 50%, the sintered body (I) undesirably has low strength.

For the impregnation with a resin, the inorganic continuously porous sintered body (I) has an open porosity (vol/vol %), defined below, of at least 10%, preferably 15 to 35%. When the open porosity is less than 10%, the improvement in properties by the impregnation is insufficient. When the open porosity is 35% or less, particularly 25% or less, the resin-impregnated sintered substrate exhibits flame retardancy of at least V-0 in UL standard test without incorporating a flame retardant into the resin.

The "true porosity (vol/vol %)" is a porosity obtained by the following conversion based on a specific gravity.

$$\text{True porosity (vol/vol \%)} = (1 - \rho/\rho_0) \times 100$$

$\rho_0$=true specific gravity or density of ceramic $\rho$=specific gravity or density of inorganic continuously porous sintered body (I)

The "open porosity" (=continuous porosity) in the present invention is almost equivalent to a porosity obtained by conversion based on a water absorptivity wt/wt %, and the equation for the conversion based on a water absorptivity wt/wt % is as follows.

$$\text{Open porosity (vol/vol \%)} = w\rho/(100-w) \times 100$$

w=water absorptivity wt/wt %

$\rho$=specific gravity or density of inorganic continuously porous sintered body (I)

When the closed porosity (=true porosity−open porosity) is about 10%, the inorganic continuously porous sintered body (I) may be used in the present invention, while the closed porosity is preferably 5% or less, more preferably 2% or less. In the use in the present invention, generally, the smaller the better. When a large amount of closed pores are present or closed pores are unevenly distributed, or when a large sintered portion of ceramic as a raw material is locally present, closed pores which are not impregnated with a resin may open, or a large area of the ceramic may be exposed when the resin-impregnated sintered body (substrate) is machined. As a result, the resin-impregnated sintered body is fragile and has portions not improved in chemical resistance. In some cases, undesirably, the resin-impregnated sintered body has a nonuniform residual stress distribution so that it may undergo cracking.

The thickness accuracy and the average surface roughness, the surface roughness in particular, reflect the size and variability of the pore diameters when the sintered body is sliced to form thin sheets. Further, when the surface of the inorganic continuously porous sintered body (I) is smoothed by polishing, the smoothing naturally reflects the pore diameter. In view of these, it is preferred that the pores should be distributed as uniformly as possible and should be as small as possible.

On the other hand, in the present invention, the sintered substrate is impregnated with a resin for greatly improving the sintered substrate in properties such as machinability and chemical resistance. From this viewpoint, preferred is a sintered substrate which is easily impregnated with a resin but hardly oozes the resin and which permits the successive extrusion of the resin through continuous pores at the time of molding under heat and pressure.

In view of the above two points, the latter point in particular, the average pore diameter is preferably 0.1 to 10 μm, particularly preferably 0.2 to 6 μm.

In the present invention, further, in view of the correlation between the machinability and the strength of the produced substrate, the inorganic continuously porous sintered body (I) has a Shore hardness (HS) of 45 or less, a Vickers hardness (HV) of 300 or less and a flexural strength of at least 40 MPa, preferably at least 50 MPa. When the HS and HV respectively exceed 45 and 300, undesirably, it is difficult to process the inorganic continuously porous sintered body (I) with a processing apparatus generally used for glass-epoxy laminates, and it is difficult to carry out precision processing on it, which results in an increase in cost. When the flexural strength is less than 40 MPa, the inorganic continuously porous sintered body (I) is poor in handling properties, for example, in the step of impregnation, since it is fragile when used as one having a thickness of about 1 mm. Further, undesirably, cracking is liable to occur when a resin-impregnated sintered substrate and a metal foil are press-formed.

Sintered substrate (II)

The sintered substrate (II) used in the present invention is a 0.2 to 10 mm thick thin sheet obtained from the above inorganic continuously porous sintered body (I). It is produced by preparing a green sheet produced by an extrusion method, etc., sintering the green sheet to obtain a thin sheet directly and polishing the surface of the thin sheet, or obtained by slicing the inorganic continuously porous sintered body (I) having the form of a block and having a thickness of at least 10 mm into thin sheets.

A sintered body having a thickness of at least 2 mm can be produced by directly sintering a green sheet produced by an extrusion method to form a thin sheet, and a sintered substrate having a thickness of less than 2 mm and up to about 1.5 mm can be produced by polishing the surface of the above sintered body and can be used as a sintered substrate (II) in the present invention. When a thin sheet can be produced by some improved method, the thin sheet can be naturally suitably used in the present invention.

Meanwhile, in actual practice, when the inorganic continuously porous sintered body (I) is actually produced by sintering a green sheet, generally, the area or size of the sintered body (1) is nearly in proportion to its thickness. For example, when an inorganic continuously porous sintered body having a size of 200 mm×200 mm, the smallest thickness that can be attained is about 2 mm, and when it has a size of 100 mm×100 mm, the smallest thickness that can be attained is about 1.5 mm.

The reasons therefor are as follows. First, the sintered body generally has a roughened surface caused by the sintering-induced contraction so that it is required to polish the surface. A thin sheet of the sintered body is liable to undergo distortion and twisting due to sintering-induced contraction and delicate variability of calcining conditions, and further, since the thin sheet is generally fragile, it is difficult to polish its surface. Second, since the thin sheet is hard to polish, there has been substantially no use of itself.

For the above reasons, the process for the production of the above thin sheet, particularly, for the industrial production thereof, has not been seriously studied.

Under the circumstances, in the present invention, preferably, a thin sheet having a thickness of up to about 6 mm is sliced from a block of the inorganic continuously porous sintered body (I) which is easy to produce and almost free of variability, and used as a sliced thin sheet (sintered substrate (II)).

The above sliced thin sheet is produced by impregnating a block of the inorganic continuously porous sintered body (I) with a liquid organic substance (OR) under vacuum, then slicing the resin-impregnated sintered body to a predetermined thickness of 0.2 to 6.0 mm, and removing the organic substance (OR) by extraction, gasification, decomposition or pyrolysis.

The organic substance (OR) works, first, to clog the pores of the inorganic continuously porous sintered body (I) for preventing the penetration of a polishing agent or a cutting medium into the pores and the deterioration of the sintered substrate. It works, second, to overcome the fragility of the inorganic continuously porous sintered body (I) when thin sheets are produced.

The liquid organic substance (OR) is selected from organic solvents such as alcohol, ester, ketone and aromatic hydrocarbon, plasticizer, wax, an addition-polymerizable resin monomer, and an addition-polymerizable thermosetting resin.

Examples of the organic solvent, the plasticizer and the wax include organic compounds free of polymerizability and self-reactivity, such as octanol, octanediol, (poly)ethylene glycol, (poly)ethylene glycol dialkyl ether, 1,4-butanediol, 1,6-hexanediol, neopentyl glycol, trimethylolpropane, pentaerythritol, diacetoneacrylamide, N-methylolacrylamide, p-ethylphenol, p-octylphenol, cresol, naphthol, ethylene carbonate, p-xylene, liquid paraffin, paraffin wax, triphenyl phosphate, bees wax, haze wax, and dioctyl phthalate.

Examples of the addition-polymerizable resin monomer include styrene, vinyltoluene, vinyl acetate, acrylic acid, methacrylic acid, (meth)acrylic acid alkyl esters, 2-hydroxyethyl (meth)acrylate, 2-hydroxypropyl (meth)acrylate, ethylene glycol di(meth)acrylate, 1,4-butanediol di(meth)acrylate, trimethylolpropane tri(meth)acrylate, pentaerythritol tri(meth)acrylate, a hydrogenated bisphenol A type epoxy resin, trimethylolpropane triglycidyl ether, (poly)propylene glycol diglycidyl ether, 1,4-butanediol diglycidyl ether, (poly)ethylene glycol diglycidyl ether, epoxidized vinylcyclohexene, diglycidylhexahydrophthalic acid, and a composition prepared by incorporating a proper catalyst or curing agent into a polymerizable, crosslinkable or curable compound.

Examples of the addition-polymerizable thermosetting resin includes an epoxy resin, an unsaturated polyester resin, a diallyl phthalate resin, an acrylic resin, a cyanate resin, a cyanate-epoxy resin, a cyanate-maleimide resin, a cyanate-maleimide-epoxy resin, a maleimide resin, a maleimide-vinyl resin, a bisallylnadimide resin, and others. These resins may be used alone or in combination.

The liquid organic substance (OR) is preferably selected in view of the following points. (1) The inorganic continuously porous sintered body (I) is not corroded. (2) It is a liquid having a low viscosity or forms a stable liquid under heat. (3) It does not react with a cutting medium. (4) It can be completely removed by extraction, gasification, decomposition, pyrolysis or other means. These four points are essential requirements. (5) The inorganic continuously porous sintered body (I) impregnated with a resin can be bonded with an adhesive. (6) It has no solubility, or almost no solubility, in a cutting medium. (7) It has neither toxicity nor ignitability, and is highly safe in other points. (8) It is a solid, or can be converted to a solid, under environmental conditions, generally at a temperature of 40° C. or lower. These four points relate to handling properties. (9) It can provide lubricity. (10) It can improve the inorganic continuously porous sintered body (I) in physical properties, particularly, impact resistance.

For example, when a cutting oil is used, trimethylolpropane (TMP) is preferred, since it satisfies the above (1) to (8), shows (9) and further exhibits the effect of (10) although it is a compound having a low molecular weight. Trimethylolpropane is suitable for use with a blade saw or a multiblade saw using a cutting oil containing grinding particles.

When the cutting medium is water, triphenyl phosphate (TPP) is similarly preferred.

Further, when it is necessary to improve the strength for producing a broad sheet or a thin sheet in particular, it is preferred to select a polymerizable, crosslinkable or curable compound and polymerize, crosslink or cure it, although it may be poor in the above points (4) and (9).

The impregnation under vacuum is preferably carried out at room temperature or a decreased temperature under a pressure of 7 kPa or less, preferably 3 kPa or less in a range in which the organic substance (OR) does not boil.

When the liquid organic substance (OR) used for the impregnation is a polymerizable, crosslinkable or curable compound, the reaction is completed to improve the reinforcing effect.

The resin-impregnated inorganic continuously porous sintered body (I) can be sliced with a slicing apparatus having a fixed blade such as a diamond cutter having a peripheral cutting edge, a diamond cutter having an inner cutting edge, a diamond-fixed wire cutter, a diamond-fixed multiblade saw, a diamond-fixed blade saw or a blade saw having an ultrahard steel blade, or apparatus for cutting ceramic such as a wire cutter or a multiblade saw using lubricant oil or water containing grinding particles. In particular, in the present invention, the above apparatus and the slicing or cutting conditions are properly selected such that the sliced sintered body is free of distortion or twisting and has a smooth surface.

The organic substance (OR) used for the impregnation is removed from the above-sliced sintered body by one, or a combination, of extraction, decomposition and pyrolysis. Generally, the organic substance (OR) is preferably completely removed by a method in which it is preliminarily extracted, gasified or decomposed at a temperature between room temperature and 150° C., then, it is gasified or pyrolyzed at a temperature not exceeding about 550° C. under reduced pressure as required, and finally it is heat-treated at a maximum temperature of 900° C. or lower.

For example, TMP and TPP are easily soluble in a solvent having a low viscosity such as methanol, acetone or methyl ethyl ketone. TMP has a boiling point of 292° C., and TPP has a boiling point of 370° C. In this case, the organic substance is solvent-extracted in methanol, acetone or the like using ultrasonic wave, the impregnated sintered body is dried at a temperature of 150° C. or lower to remove the solvent, and the sintered body is further temperature-increased up to 300° to 400° C. with a dryer having a catalyst combustion device for treating exhaust gas and a solvent recovery device, to completely remove the organic substance.

When a thermosetting resin is used, it is removed by heat treatment at a maximum temperature of 600° to 900° C., preferably 700° to 800° C., in an atmosphere containing oxygen.

The above-explained sintered substrate (II)used in the present invention has a thickness of 0.1 to 10 mm, preferably 0.2 to 6 mm, a thickness accuracy of preferably within ±30 μm, particularly preferably within ±20 μm, per a distance of 2 to 50 mm, and a 10-point average surface roughness of 30 μm or less, preferably 20 μm or less, particularly preferably 10 μm or less.

The sintered substrate (II) is porous, and generally, has continuous pores having a normal distribution with their average pore diameter as a center. The sintered substrate (II) has pores having large sizes although the number thereof is very small. When the sintered substrate (II) is measured for a surface roughness, the pores having large sizes are sometimes measured. In this case, measurement values caused by the large pores are omitted or, the substrate (II) is measured in other portion(s).

For example, however, when the local thickness accuracy exceeds ±15 μm per a distance which is greater than the above but less than 2 mm (e.g., a saw mark caused by cutting), or when a sintered substrate (II) having an Rz of over 30μm is used to produce a metal-foil-clad board of which the adhesive layer is substantially not distinguishable, the surface of the sintered substrate (II) is reflected on the metal foil surface while the surface roughness is reduced, and it is not possible to produce a metal-foil-clad board of which the metal foil has an Rz of 10 μm or less. When the sintered substrate (II) obtained by a cutting method is used, there are selected cutting conditions under which no cutting mark caused by a saw is distinguished.

Further, when the sintered substrate (II) has a thickness accuracy of over ±30 μm per a distance of 2 mm to 50 mm, the sintered substrates (II) are liable to undergo cracking particularly when a large number of the sintered substrates (II) are simultaneously press-formed with a press-forming frame (die).

Post-treatment of Sintered Substrate (II)

Surface treatment for adhesion

When a sintered body of an inorganic powder having a small polarity such as an aluminum nitride sintered body is used as a continuously porous ceramic layer, the adhesion strength to a copper foil is inferior in some cases. In particular, when a low-profile copper foil is used, the above sintered body sometimes shows practically insufficient adhesion strength. It is assumed that the variability of adhesion strength of an aluminum nitride sintered body depends upon the kind of a secondary component (h-BN) used for the production of the sintered body.

The surface treatment for adhesion is carried out for reliably producing a metal-foil-clad composite ceramic board which exhibits practically sufficient adhesion strength particularly when a low-profile copper foil is used.

The surface treatment for adhesion is carried out by impregnating the sintered substrate (II) with a solution of an organometal compound (OM1) and pyrolyzing the organometal compound (OM1) by heat treatment at a final maximum heating temperature of 650° to 800° C., to form an oxide or a composite oxide on the surface including the pore surfaces.

Examples of the above organometal compound (OM1) include organometal compounds of aluminum, titanium and silicon, and these organometal compounds may be used alone or in combination as required. Of these organometal compounds, it is preferred to use one which is easily soluble in an organic solvent, and one which has a higher melting point and a higher pyrolysis temperature tends to be desirable. An aluminum compound is the most preferred.

Specific examples of the aluminum compound include aluminum chelates such as aluminum isopropylate, aluminum ethylate, aluminum sec-butylate, aluminum mono-sec-butoxydiisopropylate, aluminum isopropoxide, ethylacetoacetate aluminum diisopropylate, aluminum tris (ethylacetoacetate), aluminum monoacetylacetoacetonate bis(ethylacetoacetate), aluminum tris(acetylacetonate) (aluminum-acetylacetone); and cyclic aluminum compound oligomers such as cyclic aluminum oxide octylate, cyclic aluminum oxide stearate and cyclic aluminum oxide isopropylate.

Examples of the titanium compound include tetra-isopropoxytitanium, tetra-n-butoxytitanium, tetrakis-(2-ethylhexyloxy)titanium, tetra-stearyloxytitanium, diisopropxy-bis(acetylacetone)titanium, di-n-butoxy-bis(triethanolaminato)titanium, titanium-isopropoxyoctylene glycolate, titanium stearate, tri-n-butoxytitanium monostearate, and titanium-acetylacetone.

Examples of the silicon compound include γ-glycidoxypropyltrimethoxysilane, γ-aminopropyltriethoxysilane, methyltrimethoxysilane, methyltriethoxysilane, hexamethyldisilane, trimethylsilyl isocyanate, dimethylsilyl diisocyanate, dimethylsilyl diisocyanate, methylsilyl triisocyanate, fumanylsily triisocyanate, tetraisocyanatesilane, ethoxysilane triisocyanate, and prepolymers having a weight average molecular weight of less than 10,000 or ceramic precursors such as polysilazane, polycarbosilane, polyaminosiloxane, polyborosiloxane, polysiloxane, polysilastyrene, polycarbolan siloxane, oligomers of ladder polymer of polysilicone, polytitanocarbosilane, heptamethylvinyltrisilane, polyborodiphenylsiloxane, and boronylpyridine.

For the above impregnation, it is sufficient to use the organometal compound (OM1) in such a very small amount that all the surfaces including pore surfaces can be nearly uniformly coated with one molecular film of the organometal compound (OM1), while an large excess of a solution of the organometal compound (OM1) in an organic solvent is generally used. Even if a large excess of the above solution is used, there is no special problem in view of the improvement in adhesion.

The above impregnation is carried out under conditions where the solvent is heated but not boiled and the pressure is reduced. The pressure generally does not exceed 50 kPa, and it is preferably 7 kPa or lower.

In the heat treatment of the impregnated sintered substrate (II), the organic solvent is gasified and evaporated, and the impregnated sintered substrate (II) is further temperature-increased to pyrolyzing the organometal compound (OM1). The maximum heating temperature for the pyrolysis is 350° to 900° C., preferably 650° to 850° C., particularly preferably 700° to 800° C.

In the present invention, it is essential to form an oxide or a composite oxide produced by the pyrolysis of the organometal compound (OM1) at a temperature not exceeding 900° C., on the substrate surface including the pore surfaces. When the maximum heating temperature exceeds 900° C., undesirably, there is no longer any effect on the improvement in adhesion.

When a compound merely adheres to the substrate surface, when a decomposition product other than a pyrolysis product adheres (by general coupling treatment), or when the adhering compound is a compound formed at an intermediate temperature, e.g., at a temperature at which the maximum heating temperature is approximately 350° to 650° C., undesirably, there may be no improvement in adhesion, some compounds (OM1) proceed with the gelation of the thermosetting resin (used for the impregnation) to excess, or some other disadvantages may take place.

Treatment for high dielectric constant

For imparting a ceramic substrate with a high dielectric constant, it is general practice to devise materials and calcining conditions so as to obtain a substrate having a high dielectric constant and a high Q value. It is not known to attempt to convert a produced ceramic substrate to one having a high dielectric constant by introducing a component having a high dielectric constant into the produced ceramic substrate by post-treatment.

The sintered substrate (II) is a substance in which continuous pores of a micron order are homogeneously dispersed.

In the present invention, for attaining a high dielectric constant, the sintered substrate (II) may be impregnated with an organometal compound (OM2), treated with steam and heat-treated at a maximum temperature of 650° to 900° C. to pyrolyze the organometal compound (OM2) so that an oxide or composite oxide is formed in pores. The above organometal compound (OM2) is selected from compounds of titanium, tantalum, aluminum, zirconium, barium, calcium, strontium, lead and magnesium. These organometal compounds may be used alone or in combination. It is preferred to use the organometal compound (OM2) such that the amount of a pyrolysis product formed in pores is 1to 20% by weight.

The metal oxide or the composite metal oxide which shows a high dielectric constant is classified into two groups such as a temperature compensated group and a high dielectric constant group on the basis of their properties.

A compound of the temperature compensated group is generally a substance having a dielectric constant which does not exceed 1,000, and it shows that the temperature dependency of the dielectric constant is a positive or negative constant coefficient in a specific temperature range. Typical examples of the compound of the temperature compensated group include magnesium titanate, titanium oxide and calcium titanate.

A compound of the high dielectric constant group is generally a substance having a dielectric constant of a as high as at least 1,000. A compound of the high dielectric constant group generally shows high dependency of the dielectric constant on temperature, and it is therefore necessary to use it with attention to the temperature range in use and a temperature change ratio in the dielectric constant. Typical examples of the compound of the high dielectric constant group include barium titanate, barium stannate and calcium zirconate. Compounds included in the barium titanate gain semiconductivity and show a high dielectric constant under specific conditions, while they tend to show a decrease in Q value and insulation resistance.

For example, titania formed from titanium alkoxide has negative characteristic, and it is therefore suitable to use wollastonite, steatite and cordierite which show positive characteristic, as a material for the sintered substrate (II). When the sintered substrate (II) has characteristic opposite to the above, the temperature characteristic of the sintered substrate (II) is balanced by using a magnesium alkoxide and siloxane in combination and incorporating magnesium titanate and calcium metasilicate which have positive characteristic. Further, an aluminum nitride-boron nitride composite (AlN-h-BN) system generally has balanced characteristic in a general temperature range, and therefore, an organometal compound having negative characteristic and an organometal compound having positive characteristic are used not to impair the balanced characteristic.

When the organometal compound (OM2) is converted to an inorganic substance, a composite oxide from a component of the sintered substrate (II) and the organometal compound is sometimes locally formed so that the dielectric constant and the temperature change ratio thereof are affected as compared with an oxide from the organometal compound alone. In this case, the kind and amount of the organometal compound (OM2) and conditions of the heat treatment are determined to bring the dielectric constant into a desired value by taking the formation of the composite oxide and the influence of the formation into consideration.

Specific examples of the organometal compound (OM2) include titanium-containing organometal compounds such as tetra-isopropoxytitanium, tetra-n-butoxytitanium, tetrakis-(2-ethylhexyloxy)titanium, tetrastearyloxytitanium, diisopropoxy-bis(acetylacetone) titanium, di-n-butoxy-bis(triethanolaminato)titanium, titanium-isopropxyoctylene glycolate, titanium stearate, tri-n-butoxytitanium-monostearate and titanium-acetylacetone; tantalum-containing organometal compounds such as tantalum ethylate; aluminum-containing organometal compounds such as aluminum isopropylate, aluminum ethylate, aluminum-sec-butylate, aluminum-mono-sec-butoxydiisopropylate, aluminum isopropoxide, ethylacetoacetate aluminum diisopropylate, aluminum tris (ethylacetate), aluminum monoacetylacetonatebis (ethylacetoacetate) and aluminum tris(acetylacetonate) (aluminum-acetylacetone); zirconium-containing organometal compounds such as zirconium butylate; barium-containing organometal compounds such as barium-isobutylate, barium-tert-butylate, barium oxalate, barium naphthenate, barium octylate, barium stearate and barium-acetylacetone; calcium-containing organometal compounds such as calcium ethylate, calcium n-butylate, calcium methylate, calcium oxalate, calcium naphthenate, calcium octylate, calcium stearate and calcium-acetylacetone; strontium-containing organometal compounds such as strontium isopropylate and strontium n-butylate; lead-containing organometal compounds such as lead naphthenate, lead octylate, lead stearate and lead acetate; and magnesium-containing organometal compounds such as magnesium ethylate, magnesium acetate, magnesium stearate, magnesium naphthenate and magnesium acetylacetone. Organometal compounds containing a plurality of metals such as titanyl barium oxalate are also included as those which can be naturally used.

The dielectric constant which a substrate for high frequency is required to have for a decrease in size and weight of a part, high performance and mass-productivity of the part, is generally 100 or less, preferably 9 to 60, particularly 9 to 40, and the temperature dependence of the dielectric constant is low.

In the present invention, therefore, the organometal compound is selected to impart the sintered substrate with a dielectric constant in the above range. In the present invention, the organometal compound is mainly selected from those which form a compound of a temperature compensated group.

A high dielectric constant is attained by, first, impregnating the sintered substrate (II) (including the inorganic continuously porous sintered body (I)) with the organometal compound (OM2), then generally, treating the sintered substrate (II) impregnated with the organometal compound (OM2), with steam to convert the organometal compound (OM2) to a compound which is easily decomposable with metal hydroxide or under heat, and further heat-treating the sintered substrate (II) to remove hydroxyl group and organic group from the compound and to deposit a more stable oxide or composite oxide in pores.

For the above impregnation, at least one organometal compound (OM2) which is melted to form a liquid at room temperature or at a temperature lower than the pyrolysis temperature is used, or there is used an organometal compound (OM2) solution which permits the control of its viscosity and the amount of the organometal compound (OM2), and the solvent for the above solution is selected in kind and amount such that the organometal compound (OM2) can be stably present.

The solvent used for the organometal compound (OM2) solution preferably includes hydrophilic compounds such as acetic acid, methanol, ethanol, propanol, butanol, acetone, methyl ethyl ketone and methoxyethanol, and other volatile compounds such as mineral spirit.

The impregnation is preferably carried out under reduced pressure at a temperature at which the organometal compound or the optionally used organic solvent is not boiled. The organometal compound (OM2) undergoes pyrolysis in a narrow temperature range under heat. The temperature at which the pyrolysis is initiated differs depending upon the kind of the organometal compound (OM2), while most of those which can be handled at room temperature have a pyrolysis initiation temperature in the range of from approximately 100° to 400° C. Further, some of the organometal compounds undergoes polymerization under heat, and some of them are volatile if they are not polymerized. When the pyrolysis operation is carried out by only heating, practically, the heating temperature higher than the pyrolysis initiation temperature is essentially required.

As a result, in the case of pyrolysis alone, part or major part of the organometal compound impregnated into pores are discharged by its decomposition gas or by being volatilized, and it is therefore difficult to retain the metal in pores effectively.

In the present invention, the treatment with steam is carried out for converting the organometal compound to metal hydroxide or partial metal hydroxide, and for converting the organometal compound to a compound in which organic group is easily separated from a metal and decomposed under heat while metal oxide, etc., are allowed to remain.

That is, the formation of the metal oxide and partial metal hydroxide is a kind of decomposition and precipitate formation, and the formed metal hydroxide and partial metal hydroxide have a greatly decreased volume as compared with the organometal compound used for the impregnation and form micro-aggregates instead of forming a compound. On the other hand, organic compounds from organic group having formed the organometal compound generally have high volatility, so that they are partially discharged to an outside depending upon the heat treatment time, to form paths leading to the outside. Further, the temperature at which a decomposition product is gasified is shifted toward a relatively low temperature. As a result, it is therefore assumed that the organometal compound is not decomposed as a whole at once, but is gradually decomposed to be removed.

The steam treatment is generally carried out at a temperature of 150° C. or lower, preferably 120° to 60° C., for 10 minutes to 24 hours. In particular, the conditions of the steam treatment are selected by taking into consideration the reactivity between the sintered substrate (II) and steam and the kind of the organometal compound (OM2) used for the impregnation.

When the sintered substrate is an oxide-based ceramic, the deterioration of the sintered substrate is trivial, and the conditions of the steam treatment can be selected depending upon the kind of the organometal compound.

A non-oxide-based ceramic, such as AlN-based ceramic, is liable to deteriorate with regard to hot water at 75° C. or higher, the steam treatment is carried out not to form water in the form of a liquid, for example, by heating the AlN-based ceramic so that the AlN-based ceramic has a temperature higher than ambient temperature.

The hydroxide and partial decomposition product formed by the above steam treatment are completely pyrolyzed by heat treatment to convert them to metal oxide and composite metal oxide which are more stable and exhibit a high dielectric constant. The heat treatment is generally carried out by temperature increase or stepwise heating.

First, the sintered substrate treated with steam above is dried at a temperature of 100° C. or lower to remove water, alcohol, organic acid and other highly volatile decomposition components. This drying is for re-opening the originally open pores of the porous material so that gas to be formed by pyrolysis thereafter is easily discharged.

Then, the partial decomposition product and the organometal compound are pyrolyzed by heat-treating the sintered substrate around the pyrolysis initiation temperature of the organometal compound for a relative long period of time while taking the pyrolysis initiation temperature of the organometal compound into consideration.

Finally, the sintered substrate is temperature-increased up to a maximum temperature of approximately 600° to 900° C., preferably approximately 700° to 850° C. and maintained at a predetermined temperature to decrease the surface area of the partial decomposition product and inactive it by oxidizing and sintering the decomposition product, so that the partial decomposition product is converted to particles of oxide or composite oxide more stably and firmly held in pores.

The atmosphere for the above heat treatment can be selected depending upon the intended compound, while it is generally preferred to carry out the heat treatment in air so that the above partial decomposition product is converted to stable metal oxide and composite metal oxide.

Thermosetting resin (R)

The thermosetting resin (R) used in the present invention is preferably selected from addition-polymerizable thermosetting resins, etc., such as an epoxy resin, an unsaturated polyester resin, a diallyl phthalate resin, an acrylic resin, cyanate resins (cyanate resin, cyanic acid ester-epoxy resin, cyanic acid ester-maleimide resin and cyanic acid ester-maleimide epoxy resin), a maleimide resin, a maleimide-vinyl resin, a bisaryl Nadiimide resin and other thermosetting resins. These resins may be used alone or as a composition.

In view of the impregnation, preferred are thermosetting resins which are in a liquid form at room temperature or are melted under heat and which have a low viscosity and hardly show a viscosity change at an impregnation temperature, such as those of which the gelation time at an impregnation temperature is at least one hour, preferably 2 hours or more. Further, preferred are those thermosetting resins which are converted to a solid without any preliminary reaction under impregnation operation conditions but when they are cooled to a temperature around room temperature after the impregnation, since they are excellent in storage stability and, in particular, are easy to handle in the step of producing a copper-clad board.

In view of the above points, acid anhydride-curable epoxy resin compositions and cyanate resins are preferred in the present invention, and a composition containing 10 to 50% by weight of an epoxy resin of novolak modified with an aromatic hydrocarbon-formaldehyde resin is particularly preferred.

A variety of aids may be incorporated into the thermosetting resin. Examples of the aid include silane coupling agents such as epoxysilane and aminosilane, titanate-containing coupling agents, aluminum-containing coupling agents and surfactants. For promoting the curing reaction, a curing catalyst may be used as required, and for retaining flame retardancy, a flame retardant may be used as required.

Resin-impregnated sintered substrate (IIR)

The sintered substrate (II) has no particular problem if it is free of moisture absorption, etc., since it is stored in a closed system after produced. However, when the sintered substrate (II) has absorbed water in air so that the affinity or adhesion thereof with/to the resin used for the impregnation is impaired, absorbed water sometimes prevents the impregnation to cause a portion which cannot be impregnated.

The sintered substrate (II) is therefore fully dried before use or at a step before the impregnation operation. The above drying is carried out at a temperature of 70° to 250° C. under a pressure of 4 kPa or lower for 0.5 to 72 hours, and the drying conditions such as heating stepwise, a reduced pressure, etc., are properly selected depending upon the kind of the sintered substrate (II).

The sintered substrate (II) is preferably impregnated with the thermosetting resin (R) as follows. The thermosetting resin (R) which is melted and preferably degassed under vacuum is injected at a pressure of 7 kPa or lower, preferably 4 kPa or lower, particularly preferably 0.7 kPa or lower, for 10 minutes to 10 hours, preferably 15 minutes to 2 hours, and the resin-impregnated sintered substrate (IIR) is taken out, and preferably cooled to solidify the thermosetting resin to obtain a resin-impregnated sintered substrate (IIR).

The resin adhering to the surface of the resin-impregnated sintered substrate (IIR) is mostly discharged to an outside of the resin-impregnated sintered substrate (IIR) when a metal-foil-clad composite ceramic board is produced, so that the amount of the above resin adhering to the substrate surface is preferably the smallest possible.

In a preferred process for the production of the metal-foil-clad composite ceramic board, there is employed a press-forming method in which the ceramic layer and the metal foil have no distinguishable resin layer therebetween.

The resin used for the production of the resin-impregnated sintered substrate (IIR) of the present invention does not require B-staging treatment of the resin unlike the resin used for the production of a glass epoxy laminate, and the B-staging treatment is rather not carried out. When it is intended to precisely control the amount of the resin adhering to the surface of the resin-impregnated sintered substrate (IIR) such that the amount is the lowest possible, a preliminary reaction may be carried out so long as the high fluidity of the resin can be maintained for about 5 minutes or more at a press-forming time.

Metal foil

The metal foil used in the present invention can be selected from a copper foil, an aluminum foil, a nickel foil, a nickel-plated copper foil, a nickel-plated copper foil with an adhesive layer, a thin copper foil with an aluminum foil, a metal core with a copper foil formed by temporality attaching a copper foil to one surface of an aluminum and a metal core with double copper foils formed by temporarily attaching copper foils to both the surfaces of an aluminum, iron or stainless steel sheet having a thickness of 0.07 to 0.7 mm.

Preferred is a structure in which the metal foil is attached as close to the surface of the sintered substrate (II) as possible. In view of this point, the surface roughness Rz of the uneven surface which is generally formed on the reverse-side surface of the metal foil for strengthening the adhesion strength is preferably about 5 μm or smaller, and a copper foil having the above surface roughness Rz is preferred. For example, a low-profile-treated (LP foil, VLP foil), silicone-treated or black oxide-treated copper foil, and a black oxide-treated reduced copper foil are included in the above copper foil.

In the present invention, particularly preferred is an aluminum-core copper foil produced by temporarily bonding low-profile copper foils to both the surfaces of an aluminum alloy sheet having a thickness of approximately 0.1 to 0.5 mm through a heat-peeling adhesive.

Auxiliary materials for press-forming

The sintered substrate (II) has a constant thickness and a constant size, and has substantially no dimensional change under press-forming conditions except for a change based on thermal expansion. However, it is fragile and easily undergoes cracking when an impact is exerted thereon. For reliable industrial production, auxiliary materials for press-forming are therefore required to cope with the above.

Press-forming frame

The press-forming frame is used for placing a plurality of sets of laminates between pressing hot plates and forming the laminates under heat and pressure, and then the laminates are taken out, post-cured as required, and gradually cooled.

The above frame has a structure formed of two thick rectangular or square metal plates as upper and lower plates, laminates-positioning pins provided on four sides, and fixing tools for removably fixing the upper and lower plates. A metal is suitable as a material for the upper and lower plates, and an aluminum alloy for a structural material or a die material is preferred since it is light in weight.

The pins for positioning the laminates include shrink and stretch type or bending type pins which are compatible with the amount of laminates placed in the frame, and the thickness of the laminates at each time when the laminates are placed and when the press-forming is completed, and the lower pressing plate is provided with at least one pin, preferably at least two pins, on each side.

The method of removably fixing the upper and lower pressing plates includes a method using clips or springs as the fixing tools, and a method using male and female pins utilizing thermal expansion coefficients (a method in which pins having a high thermal expansion coefficient are used as male pins and an increase in temperature is utilized for fixing). Each of the upper and lower pressing plates is provided with at least one pin, preferably at least two pins, on each side.

Plate heater

When the press-forming method or a press-forming apparatus has the upper limit of heating temperature, a plate heater can be suitably used as auxiliary heating means having a high degree of freedom for post-curing or gradually cooling the metal-foil-clad composite ceramic board which has been formed and taken out. The plate heater is provided on each of the upper and lower pressing plate or between the laminate and the upper pressing plate and between the laminate and the lower pressing plate.

The plate heater includes a heater formed by providing a linear, tape-shaped or other heating medium between two plates having flat and smooth outer surfaces and providing a terminal for temperature control; and a heater having an inner layer of a resistant material pattern formed on a resistance material foil such as a nickel-chromium alloy foil, according to the process for producing a multi-layer ceramic board to be described later.

Reverse cushion

The reverse cushion is used for absorbing an excessive resin which flows out of the resin-impregnated sintered substrate (IIR). The reverse cushion prevents the following problems which may take place when it is not used. The resin which flows out of the resin-impregnated sintered substrate (IIR) is cured alone and firmly adheres to the metal-foil-clad composite ceramic board, and it is difficult to remove the resin. When the metal-foil-clad composite ceramic board has a large size, e.g., more than 500 cm$^2$, the composite ceramic layer undergoes cracking due to a difference in thermal expansion coefficient when the board is cooled. Further, the reverse cushion alleviates the superfluousness of the resin and a local load of pressure.

Preferably, the reverse cushion is porous and has low strength. Particularly preferably, the reverse cushion can be easily destroyed even when an absorbed resin is cured, and its thickness becomes smaller than that of the sintered substrate (II) under press-forming pressure. Paper is particularly preferred. The reverse cushion includes cotton paper, cardboard, corrugated paper and reclaimed paper.

In that portion of the reverse cushion which is close to the sintered substrate (II), for example, a tape is attached or a coating composition is cured to control the absorption. That is, the above portion does not absorb a resin or is poor in absorption. The reason therefor is that when the above portion has good absorption capability, resin in pores of the resin-impregnated sintered substrate (IIR) is also absorbed or removed. The reverse cushion has a sufficient width for absorbing the superfluous resin.

When the sintered substrate (II) has a small size, there is employed a method in which a plurality of sets for the metal-foil-clad composite ceramic boards are simultaneously press-formed (multiple press-forming). For this method, the reverse cushion has a plurality of cut-out portions each of which has a size of the sintered substrate (II). The reverse cushion preferably has a rectangular form.

Heat-resistant cushion

The cushion material is used for the uniform application of a pressure and for avoiding an impact to be exerted on a laminated material. The heat-resistant cushion material is selected from known cushion materials. In the present invention, it is preferred to use a cushion material having thermal conductivity which is low until a press-forming pressure is exerted and which is greatly increased when the pressure is exerted. Specifically, it is particularly preferred to use a cushion material formed by arranging unwoven fabric of a carbon fiber having a high thermal conductivity between metal sheets such as aluminum sheets, in view of heat resistance, cushion property and a change in thermal conductivity.

Others

The metal plates having a flat and smooth surface such as stainless steel, used for the press-forming, include metal plates of iron and aluminum in addition to stainless steel. The metal plates have a thickness of 1 mm or less, for example, approximately 0.1 to 0.7 mm.

When a thick metal foil, e.g., a metal foil having a thickness of 70µm or more, is used, or when a foil having a core of aluminum or iron and a cooper foil is used, it is not particularly required to use the above plates. The hardness and surface smoothness of the above plates under the press-forming conditions are related to the surface smoothness of the metal-foil-clad composite ceramic board with them. When stainless steel plates having mirror surfaces are used, for example, the sintered substrate (II) and a copper foil form a smoother surface having an Rz of 2 µm or less, while the same sintered substrate (II) and the same copper foil tend to form a surface having inferior smoothness, i.e., an Rz of 3–4 µm when aluminum plates or aluminum alloy plates are used, which is, however, no problem in practical use.

The press-forming apparatus can be selected from a conventional reduced-pressure multiple heat press arranged for pressing under heat under reduced pressure or vacuum, an autoclave, a vacuum bag packing press and others.

The sintered substrate (II) for forming the metal-foil-clad composite ceramic board is fragile and easily cracked by an impact or an excessive bending stress, and it is therefore essential to take utmost care not to apply a load of a pressing hot plate at too high a rate and not to exert a nonuniform pressure caused by the deviated parallelism of a pressing hot plate when the pressing hot plate is used.

Production of metal-foil-clad composite ceramic board

The metal-foil-clad composite ceramic board of the present invention is produced by stacking a metal foil on both surfaces of each of the above sintered substrates (II) impregnated with the thermosetting resin (R), i.e., the resin-impregnated sintered substrates (IIR), stacking a plurality of the resultant laminates through metal plates having a flat and smooth surface, a metal plate between one laminate and another adjacent laminate, placing cushions on sides of the resultant set, placing the set between the pressing hot plates, pressing the set under heat (press-forming), removing the pressure as required after the sintered substrates is impregnated and the resin is cured, and forcibly cooling or self-cooling the set.

In a preferred embodiment of the press-forming, first, the ambient atmosphere is pressure-decreased and degassed with increasing the temperature, the pressure of 20 kPa or lower, preferably 7 kPa or lower, is maintained for at least 5 minutes, then, the load of 0.2 to 8 MPa, preferably 0.4 to 4 MPa, is exerted as a press-forming pressure so that the adhesion surface of each metal foil and the resin are made to fit to each other while discharging the superfluous resin, and the resin (R) is gelled and cured.

The degassing under reduced pressure is preferably carried out by decreasing the pressure to the lowest before the resin of the resin-impregnated sintered substrate (IIR) is melted, and is preferably carried out under the same vacuum degree and in the same temperature range as those employed for impregnating the sintered substrate (II) with the resin (R).

After the resin is melted and the press-forming pressure is applied, the decreased pressure is alleviated to inhibit the gasification of the resin, and the reduction of the pressure is terminated. Further, when the gasification of the resin is found, the reduction of the pressure is terminated. Moreover, the reduction of the pressure is completed before a temperature at which the curing reaction of the resin substantially starts is reached.

When the press-forming pressure is applied, the superfluous resin which is melted to gain flowability is discharged out of the resin-impregnated sintered substrate (IIR), the adhesion of the metal foil is increased, and the resin-composite ceramic layer exhibits its properties. The pressure is applied at a stage where volatile components are substantially removed by the above degassing under reduced pressure and the resin starts to be melted. It is preferred to carry out the degassing for at least 5 minutes before the pressure is applied, and the pressure is in the range of 0.2 to 8 MPa, preferably 0.4 to 4 MPa. The pressure is applied stepwise as required.

The curing temperature is properly determined depending upon the kind of the thermosetting resin (R) used for the impregnation. In the present invention, however, the resin which can be used for the impregnation under vacuum is selected, and generally, no catalyst is used or a catalyst is used in a very small amount. As a final curing temperature, it is therefore generally preferred to select a temperature a little higher than a usually employed temperature.

When the resin layer between the sintered substrate (II) and the metal foil has a large thickness, or when the molten resin has a small flow distance, a superfluous resin flows through a gap between the sintered substrate (II) and the metal foil and is discharged. However, when the thickness of the resin layer decreases, the resin is no longer discharged through the gap. When the sintered substrate (II) having a large thickness is used in the present invention, the oozing of the resin (R) from the side and end surfaces thereof is observed.

On the basis of the above observation it is considered that the remaining thin resin layer is discharged by being successively extruded through the continuous pores of the sintered substrate (II) to form a board in which the convex portions of the uneven (convex and concave) surface for the adhesion are substantially in intimate contact with the ceramic.

As described in Referential Example 1 to be described later, the gelation time was smaller than that in Referential Example 2 to be described later, while no adhesive layer was observed, and the resin viscosity slowly increased, so that the resin was presumably extruded successively. In Referential Example 2 in which the gelation time was longer than that in Referential Example 1 and in Referential Example 3 in which the gelation time was approximately as long as that in a conventional case, a thick adhesion layer remained, and the thickness of the layer varied. It is assumed that in these two Referential Examples, the successive extrusion of the resin was inhibited by a sharp increase of the resin viscosity and the initiation of the gelation reaction.

In the present invention, it is to be noted that the gelation time is not a factor determining the press-forming conditions unlike that for a conventional glass epoxy prepreg.

Production of composite ceramic multi-layer board

The composite ceramic multi-layer board is produced by placing a 0.1 to 3 mm thick resin-impregnated sintered substrate (to be referred to as "substrate PI" hereinafter) on that surface of a composite ceramic board (to be referred to as "substrate (PCI)" hereinafter) on which a printed wiring network for an inner layer is formed, the composite ceramic board having a printed wiring network for an inner layer on one or each surface thereof, and optionally stacking a metal foil for an outer layer, and press-forming the resultant laminate having the above constitution.

In the production of the composite ceramic multi-layer board, it is essential that the thermal expansion coefficients and behaviors of the layers should be substantially the same and that the stress caused by the interlayer adhesive layer and a conductive metal foil of the inner layer, having different thermal behaviors, should be as small as possible.

In view of the above points, the following arrangements are preferred. The substrate (PCI) and the substrate (PI) are formed of the same sintered substrate (II) from the same inorganic continuously porous sintered body (I), the thermosetting resin (R) and the thermosetting resin (R') are the same, the sintered substrate (II) has a thickness accuracy of within ±30 µm, preferably within ±20 µm and a 10-point average surface roughness of 30 µm or less, the metal-foil-clad composite ceramic board has a thickness accuracy of within ±20 µm, and the metal foil has a 10-point average surface roughness Rz of 10µm or less, preferably 5µm or less. Further, the substrate (PCI) is formed of a metal-foil-clad composite ceramic board in which the metal foil has a 10-point average surface roughness, the heat-cured resin layer forming an adhesive layer for the metal foil is substantially nil or has a thickness of 10 µm or less, and the substrate (PCI) has a printed wiring network for an inner layer on one or each surface thereof. Furthermore, the substrate (PI) has, formed in its ceramic portion, grooves having a width and a depth which correspond to, and are sufficient for receiving, convex portions of the metal foil including the printed wiring network of the substrate (PCI) which is to be bonded to the surface of the substrate (PI).

The substrate (PCI) includes the following 1) and 2) obtained from a substrate obtained by a method in which the inorganic continuously porous sintered body (I) is impregnated with the thermosetting resin (R) under vacuum, the resin is cured to form an integrated block and the block is sliced into thin boards to prepare resin-impregnated composite sintered bodies, and also includes the following 3) obtained from a metal-foil-clad composite ceramic board.

1) a substrate obtained by metal-plating one surface or each surface of the resin-impregnated composite sintered body and forming a printed wiring network for an inner layer and guide holes.

2) a substrate obtained by forming grooves for a printed wiring network for an inner layer on our surface or each surface of the resin-impregnated composite sintered body and forming a metallized printed wiring network and guide holes in the grooves.

3) a substrate obtained by forming a printed wiring network for an inner layer on one surface or each surface of the metal-foil-clad composite ceramic board by a known etching method.

Further, the substrate (PI) includes the following 4) and 5).

4) a substrate which is the above-explained resin-impregnated sintered substrate (II).

5) a substrate obtained by forming, in its ceramic portion, grooves having a width and a depth which correspond to, and are sufficient for receiving, convex portions of the metal foil including the printed wiring network of the substrate (PCI).

The substrate (PI) is obtained by complicated steps, while it is preferred since the amount of the resin layer portion of which the thermal expansion coefficient is greatly different from that of the cured resin composite ceramic layer can be as small as possible.

The grooves in the above grooved substrate 5) can be formed by a mechanical cutting method or an etching method.

When the mechanical cutting method is used, the sintered substrate (II) is required to have strength and tenacity sufficient for the mechanical cutting. In view of this point, the sintered substrate (II) impregnated with a resin is used, and after the cutting, the resin is completely removed by dissolving or thermal decomposition.

In the etching method, the portion for the groove is exposed (that portion other than the portion for the groove is provided with a protection layer), and that portion of the sintered substrate (II) which is to form the groove is dissolved in a predetermined amount. The dissolving agent is a solution which does not dissolve, or sparingly dissolves, the protection layer. When the ceramic is wollastonite, an aqueous solution of an acid is used. When the ceramic is aluminum nitride, an aqueous solution of an alkali is used.

When a substrate obtained by impregnating the sintered substrate (II) with a resin and slicing the resin-impregnated sintered substrate (II) is used, the portion for the groove is exposed by a method in which the resin in the portion for the groove is gasified and decomposed with laser-patterning.

When a substrate which is not impregnated with a resin is used, pores of the substrate are impregnated with water, an organic substance or other in the same manner as in the preparation of thin boards by slicing the inorganic continuously porous sintered body (I) and then the substrate is etched before or after the formation of a predetermined pattern with a resist film, or the like.

The above substrate (PCI), the substrate (PI) and optionally a metal foil are registered and combined so as to have a desired layer constitution, and the resultant set is press-formed to obtain the composite ceramic multi-layer board of the present invention.

Examples of the above combination, e.g., for four-layered boards are as follows.

(1) A dual-side copper-clad four-layered board formed of a combination of the substrate (PCI) having a printed wiring network on each surface thereof, the substrates (PI) placed one on one surface and the other on the other surface, and a copper foil further placed thereon.

(2) A dual-side copper-clad four-layered board formed of a combination of two substrates (PCI) each of which has a printed wiring network for an inner layer on one surface alone, and the substrate (PI) inserted between the two substrates (PCI).

(3) A four-layered board formed of a combination of two substrates (PCI) each of which has a printed wiring network for an outer layer on one surface and a printed wiring network on the other surface, and the substrate (PI) inserted between the substrates (PCI).

The multi-layer press-forming is carried out with a press-forming plate while the substrate (PCI) and the substrate (PI) are mutually strictly registered in position. The conditions of heating and curing under pressure are preferably the same as those specified concerning the process for the production of the above metal-foil-clad composite ceramic board.

When an insulating layer having a particularly small thickness and a relatively broad size is required, one surface of the metal-foil-clad composite ceramic board of the present invention is uniformly polished to form a broad plate having a thickness of 0.2 mm or less and used as such.

Processing method and use

The metal-foil-clad composite ceramic board of the present invention substantially retains the excellent physical properties of ceramic, and can be processed with a machine and an apparatus, and by a process, used for processing glass epoxy laminates. Not only the metal-foil-clad composite ceramic board of the present invention can be naturally used in place of conventional ceramic substrates, but also it can be applied to a variety of fields of use where the excellent physical properties are essential but the use of ceramic is limited due to a difficulty in its processing.

Typical examples of the processing method include the following.

Since the metal-foil-clad composite ceramic board has high heat resistance and dimensional stability under heat up to the decomposition temperature of the resin, it can be processed under conditions of a step of mounting a part of a ceramic substrate. For example, the processing method includes direct bonding, alloy bonding such as an IC chip bonding, repeated heat-treatment cycle at a high temperature, and heat cleaning.

Since the metal-foil-clad composite ceramic board has excellent machinability, the processing method includes precision drilling, spot facing, and the formation of a thin-wall part (e.g., 0.2 mm or less; showing a flexibility approximately equivalent to that of a glass foil (about 50 μm).

Since the metal-foil-clad composite ceramic board has improved chemical resistance, the processing method includes etching, electroless plating and electroplating using an aqueous solution of a chemical.

The above methods may be used in combination.

Specific examples of the field of use of the metal-foil-clad composite ceramic board are as follows.

Semiconductor packages-related items in view of thermal conductivity and thermal expansion coefficient, such as a chip on board substrate (COB substrate), a multi-chip module substrate (MCM substrate), a hybrid integrated circuit substrate (HIC substrate), a pin grid array substrate (PGA substrate), a ball grid array substrate (BGA substrate), a substrate for ASIC and LSI, a surdip substrate, an LSI and IC chip carrier, a monolithic IC multi-chip substrate, a multi-chip module substrate, a chip carrier substrate, a ceramic multi-layered substrate, a mother board, a card personal computer board, a leadless chip carrier, a cavity, a substrate for a high-speed computer and a core substrate for a build-up multiple layers;

Substrates for high-energy density control in view of high thermal conductivity, such as an ignition switch substrate (igniter, power source for automobile ignition plug), a regulator substrate, a chopper substrate, a high-voltage and high-current switching module substrate, a thyristor control substrate, a substrate for power steering control, a current control substrate, an engine control substrate, a GTO (gate turn off) substrate (substrate for IGBT (insulated gate bipolar transistor) bipolar transistor, GTO inverter substrate, substrate for power drive) and an HIC substrate for driving a stepping motor;

Items in view of dimensional stability under heat at high temperature, such as a thermal head, a thermal printer head for a facsimile machine, a charging substrate for a copying machine, a resistor array, a printedresistor circuit substrate (PRC), a flat transformer substrate, a flat motor substrate, a print motor substrate and a memory substrate;

Items for a high-frequency module in view of thermal conductivity and high-frequency characteristics, such as a high-frequency power module substrate, a VHF charging power amplification module substrate, a high-frequency transmitter for a portable telephone and a microwave integrated circuit (MIC substrate, monolithic microwave integrated circuit(MMIC circuit));

Items in view of high-frequency characteristics such as a flat antenna substrate, e.g., a substrate for global positioning system (GPS), a small-sized high-dielectric antenna, an antenna duplexer, a high-frequency filter substrate, a band pass filter, a dielectric resonator, a chip inductor substrate, a surface wave filter (aluminum nitride-based), a high-frequency coaxial connector substrate, an isolator substrate, a condenser, an S-band down converter, an S-band low-noise amplifier, an S-band power amplifier, a chip dielectric antenna and its antenna-integrated substrate, and a dielectric antenna for LAN (local area network) and its antenna-intregrated substrate;

Items for an optoelectronics module in view of high heat resistance, such as a laser transmitting and receiving substrate, a laser diode heat spreader, an LED printer head module substrate, an optical printer head substrate, and an optical character recognition sensor;

Sensor substrates in view of utilizabiity of high thermal conductivity (aluminum nitride-based) due to freedom from gas generation at high temperatures under high vacuum, such as a vacuum thin-film machine and equipment sensor and control complex substrate, a heat balance circuit substrate, a heat insulation substrate, a constant-temperature diode array substrate, and a heat logger substrate;

Substrates used in a burn-in board test in view of high heat resistance, such as a burn-in board, a burn-in flashing board, a burn-in cleaning board, a burn-in carrier substrate, and others such as a printed resister circuit substrate (PRC), a resistor array and a plane heater;

Tester probe substrates (probe diameter 0.3 mm or less) for IC, PGA, quad flat package (QFG), chip size package (CSP) and bare chip, in view of precision processability and dimensional stability; and Others such as a heat sink, a radiation insulation board, a substrate for a Peltier device used for cooling and radiation (for a small-sized electronic cooler, a CPU, a cash controller, a gate array and a RISK chip), a thermo-module and a solar cell substrate.

EXAMPLES

The present invention will be explained with reference to Examples hereinafter.

Example 1

A 35 mm×150 mm×150 mm block of an aluminum nitride-boron nitride composite material (h-BN 12 wt %, bulk density 2.45, true porosity 20.6%, average pore radius 0.66 μm, to be referred to as "AN" hereinafter) was placed in an impregnation container of a pressure-reducible impregnator and treated under heat at 110° C. for 2 hours.

Trimethylol propane (to be referred to as "TMP" hereinafter) was placed in a resin container of the pressure-reducible impregnator, and the resin container was heated to 110° C. to melt TMP.

The pressure in the reducible impregnator was maintained at 0.66 kPa at 110° C. for 30 minutes.

Then, TMP in the resin container was gradually introduced into the impregnation container until AN was completely covered with TMP, and further, the above temperature and the above pressure were maintained for 30 minutes to complete the impregnation with TMP. Then, the impregnated AN was taken out and cooled at room temperature.

The above impregnated AN was set in a multi-blade saw (blade D 0.25 mm, L 500 mm, using #600 SiC cutting oil solution), and sliced into a thin plate having a thickness of 0.635 mm and a size of 15 cm×15 cm.

The above thin plate was washed with a methanol/methyl ethyl ketone (60/40) mixed solution to remove the cutting oil and most of TMP, and then treated at 80° C. for 30 minutes. Further, the thin plate was temperature-increased and treated at a final temperature of 320° C. for 2 hours to give a TMP-removed sliced sintered body (to be referred to as "AN1" hereinafter).

A thermosetting resin composition (to be referred to as "resin R1" hereinafter) was prepared by uniformly melting and mixing 85wt % of a cyanate-maleimide resin (trade name: BT-2100, 2,2-bis(4-cyanatophenyl)propane/bis(4-maleimide phenyl)methane =9/1) and 15 wt % of a xylene-formaldehyde resin-modified novolak-epoxy resin (epoxy equivalent 259, softening point 83° C., number average molecular weight 1,163, trade name; Tetrad G, supplied by Mitsubishi Gas Chemical Co., Inc.).

The above-obtained AN1 was placed in an impregnation container, and the impregnation container was placed in the pressure-reducible impregnator. The pressure in the system was reduced to 0.66 kPa. Then, the temperature in the impregnator was increased to 110° C., and the AN1 was maintained at this temperature for 1 hour.

Further, the above-prepared resin R1 was placed in the resin container of the pressure-reducible impregnator, melted at 110° C. and degassing-treated under reduced pressure for 10 minutes.

While the reduced pressure was maintained, the above-prepared resin R1 was gradually introduced into the impregnation container through the bottom of the container at 110° C. to carry out the impregnation for 1 hour.

AN1 impregnated with the resin R1 was taken out of the pressure-reducible impregnator, and the resin on the surface was removed by dropping it. The resin R1 was also solidified to give a resin-impregnated porous board (to be referred to as "R-AN1" hereinafter).

A 18 µm thick electrolytic copper foil was placed on each of the surfaces of the above R-AN1, and the resultant laminate was sandwiched between 0.5 mm thick stainless steel plates. The resultant set was set between hot pressing plates, and the heating of the hot pressing plates and the pressure reduction were initiated. When the temperature of the R-AN1 reached a temperature of 120° C., a pressure of 0.6 MPa was exerted. When the temperature reached 140° C., the pressure reduction was terminated, and a pressure of 1 MPa was exerted. In this state, the temperature was increased up to 190° C., and the set was press-formed for 3 hours, and self-cooled to give a copper-clad composite ceramic board (to be referred to as "C-AN1" hereinafter). The time from the initiation of the pressure reduction to the exerting of the pressure of 0.6 MPa was 30 minutes long, and the time until the termination of the pressure reduction was 10 minutes long.

The above-obtained C-AN1 was measured for physical properties, and Tables 1 to 3 show the results.

Example 2

An impregnated An was obtained by carrying out the impregnation under vacuum in the same manner as in Example 1 except that TMP was replaced with an acrylic resin mixture containing 98wt % of an acrylic monomer (trade name; NK Ester HD, supplied by Shin-Nakamura Chemical Industry Co., Ltd.) and 2wt % of a mixture, as a catalyst, of 55 wt % of methyl ethyl ketone peroxide and 45 wt % of dimethyl phthalate (supplied by Nippon Oil & Fats Co., Ltd.), and carrying out polymerization at 60° C. for 3 hours.

The above-impregnated AN was sliced in the same manner as in Example 1, to give a thin plate.

The above-obtained thin plate was extraction-washed with methyl ethyl ketone, and dried under heat at 80° C. for 30 minutes. Then, the thin plate was temperature-increased up to 650° C. over 5 hours, and heat-treated at this temperature for 2 hours to remove the acrylic resin by thermoplastic decomposition, whereby a sliced substrate (to be referred to as "AN2" hereinafter) was obtained.

A copper-clad composite ceramic board (to be referred to as "C-AN2" hereinafter) was obtained in the same manner as in Example 1 except that AN1 was replaced with AN2.

The above-obtained C-AN2 was measured for physical properties, and Tables 1 to 3 show the results.

Example 3

As an inorganic continuously porous sintered body, a 30 mm thick, 200 mm×200 mm broad β-wollastonite porous material (bulk density 2.1, true porosity 27.6%, open porosity 18.5%, average pore radius 3.4 µm, trade name: Machinax, supplied by Mitsui Mining Material, to be referred to as "WC" hereinafter) was provided.

A 1 mm×200 mm×200 mm thin plate (to be referred to as "WC1" hereinafter) was obtained in the same manner as in Example 1 except that AN was replaced with WC.

A thermosetting resin composition (to be referred to as "resin R2" hereinafter) was prepared by uniformly melting and mixing 98wt % of a cyanate-maleimide resin (trade name: BT-2100, 2,2-bis(4-cyanatophenyl)propane/bis(4-maleimidephenyl)methane=9/1) and 2 wt % of a bisphenol A type epoxy resin (trade name: Epikote 152, epoxy equivalent 172–179, supplied by Yuka-Shell Epoxy K.K.).

A resin-impregnated porous material (to be referred to as "R-WC1" hereinafter) was obtained in the same manner as in Example 1 except that AN1 was replaced with WC1 and that the resin R1 was replaced with the resin R2, and R-WC1 was press-formed and cooled in the same manner as in Example 1 to give a copper-clad composite ceramic board (to be referred to as "C-WC1" hereinafter).

The above-obtained C-WC1 was measured for physical properties, Tables 1 to 3 show the results.

Referential Example 1

The same R-WC1 as that prepared in Example 3 was treated with a hot air dryer at 160° C. for 1 hour. This resin was measured for a gelation time at 180° C. to show 6 minutes 13 seconds.

A copper-clad composite ceramic board was obtained in the same manner as in Example 3 except that the above-obtained R-WC1 was used instead. The copper foil adhering portion of the copper-clad composite ceramic board was observed through a microscope to show the same result as that in Example 3.

Referential Example 2

The same R-WC1 as that prepared in Example 3 was treated with a hot air dryer at 170° C. for 10 minutes to bring it in a state where its crosslinking reaction was initiated. This resin was measured for a gelation time at 180 ° C. to show 12 minutes 27 seconds. A copper-clad composite ceramic board was obtained in the same manner as in Example 3 except that the above-obtained R-WC1 in a crosslinking reaction-initiated state was used instead. The copper foil adhering portion of the copper-clad composite ceramic board was observed through a microscope to show the presence of an adhesive layer having a thickness of 5 to 20 µm.

Referential Example 3

A small amount of (2-n-butoxycarbonylbenzoyl-oxy) tributoxytitanium (trade name: Titacoat S-181, supplied by Nippon Soda K.K.) as a catalyst was added to the same resin R2 as that in Example 3.

A resin-impregnated porous material (to be referred to as "R-WC1-2" hereinafter) was obtained in the same manner as in Example 3 except that the above-obtained resin R2 containing the catalyst was used instead, and a copper-clad composite ceramic board (to be referred to as "C-WC1-2" hereinafter) was obtained in the same manner as in Example 3 except that the above-obtained resin-impregnated porous material was used instead. The resin of R-WC1-2 was measured for a gelation time at 180° C. to show about 2 minutes.

The copper foil adhering portion of C-WC-2 was observed through a microscope to show the presence of an adhesive layer having a thickness of 10 to 50 µm. Further, a crease took place in part of the copper foil surface.

Example 4

A copper-clad composite ceramic board (to be referred to as "C-WC2" hereinafter) was obtained in the same manner as in Example 3 except that triphenyl phosphate (TPP) was used in place of TMP and that a #600 SiC cutting agent aqueous solution was used in place of the #600 SiC cutting oil solution.

The above-obtained C-WC2 was measured for physical properties and Tables 1 to 3 show the results.

Example 5

A copper-clad composite ceramic board (to be referred to as "C-SP1" hereinafter) was obtained in the same manner as in Example 3 except that a 3.0 mm×200 mm×200 mm silica-based sintered body (trade name: Machinable Ceramics P type, supplied by Ishihara Pharmaceutical Co., Ltd., catalog values; bulk density 1.9, porosity 19%, water absorptivity 10%, to be referred to as "SP" hereinafter) was used as an inorganic continuously porous sintered body instead and that it was used as a thin plate to be impregnated.

The above-obtained C-SP-1 was measured for physical properties and Tables 1 to 3 show the results.

Example 6

A thermosetting resin composition (to be referred to as "resin R3" hereinafter) was prepared by mixing 53.1 wt % of a bisphenol A type epoxy resin (trade name: Epikote 828, supplied by Yuka-Shell Epoxy K.K.), 45.1 wt % of methylhexahydrophthalic acid anhydride, 1.6 wt % of γ-glycidoxypropyltrimethoxysilane and 0.2 wt % of triethanolamine.

The same WC1 as that in Example 3 was placed in an impregnation container, and the container was placed in a vacuum impregnator. After the pressure in the system was reduced to 0.66 kPa, and then WC1 was temperature-increased to 80° C. and maintained at this temperature for 1 hour.

Further, the above-prepared resin R3 was placed in a resin container in the vacuum impregnator and degassing-treated at 80° C. for 10 minutes.

The resin R3 was gradually introduced into the impregnation container through its bottom, and the impregnation was carried out for 1 hour.

The impregnated WC1 was taken out of the vacuum impregnator, and the resin adhering to the surface was removed by dropping it. The resin R3 was also viscosity-increased by cooling it, to give a resin-impregnated porous board (to be referred to as "E-WC1" hereinafter).

A 18 μm thick electrolytic copper foil was placed on each of the surfaces of the above E-WC1, and the resultant laminate was sandwiched with 0.5 mm stainless steel plates. The resultant set was placed set between hot pressing plates members, and the heating of the hot pressing plates and the pressure reduction were initiated. When the temperature of the E-WC1 reached a temperature of 120° C., a pressure of 0.6 MPa was exerted. After 5 minutes, the pressure was increased to 2 MPa, and the pressure reduction was terminated. Then, the temperature was increased up to 190° C., and the set was press-formed for 3 hours, and self-cooled to give a copper-clad composite ceramic board (to be referred to as "CE-WC1" hereinafter). The time from the initiation of the pressure reduction to the termination thereof 20 minutes long.

The above-obtained CE-WC1 was measured for physical properties, and Tables 1 to 3 show the results.

The physical properties, etc., shown in Tables are based on the following.

*1: Bulk density: JIS-C-2141, unit g/cm$^3$

*2: Water absorptivity: JIS-R-1601, unit wt %

*3: Dielectric characteristic: JIS-C-2141, measured at 1 MHz.

*4: Thermal expansion coefficient: Measurement temperature range; room temperature→300° C., unit ×10$^{-6}$K$^{-1}$

*5: Thermal conductivity: Measured by laser flash method, unit W(mK)$^{-1}$

Substrate surface: Copper foil on each surface was removed by etching before the measurement.

Cu surface: Copper foil on one surface was removed by etching, and the other copper foil surface was exposed to irradiation with laser for the measurement.

"Peeled" means that no measurement was possible since copper foil was peeled off.

*6: Chemical resistance: Elution amount (mg/cm$^2$) after 1.6 mm×50 mm×50 mm board was immersed in a chemical shown in Tables for 24 hours. "+" stands for an increase in weight.

*7: Thickness accuracy (difference): unit μm

Copper-clad composite ceramic board was divided into nine parts and each part was measured for a thickness in an arbitrary portion with a thickness meter (Mitutoyo Digimatic Mini-Processor DP-2 DX). A difference from a predetermined thickness was taken as accuracy.

*8: Average surface roughness ($R_z$): 10-point average surface roughness $R_z$, unit μm Lateral: direction of blade, Vertical: direction of cutting of blade,

JIS B 0601-1994; ISO 468-1982

Measured with a surface roughness tester (Surfcom, supplied by Tokyo Seimitsu K.K.).

The measurement standard length for Rz; when Rz was 10 μm or less, the same standard as that in Table 3 was used. That is, when an inorganic continuously porous sintered body is measured, it sometimes show a deep valley based on pores, and this measurement value is omitted.

*9: Copper foil peel strength: Measured according to JIS C2141. unit kg/cm.

A: Ordinary state, S: After solder-dipping at 260° C. for 5 minutes.

*10: Adhesive layer: Sample was sealed with resin and cut, and measurement was made on the photograph of a cut surface.

Presence or absence of adhesive layer: Adhesion surface between copper foil and inorganic continuously porous sintered body was observed to determine the presence or absence of a resin layer distinguishable from the resin-impregnated inorganic continuously porous sintered body.

thickness or depth of adhesive layer; unit μm

Thickness when it was determined that adhesive layer was present. Depth of that concave and convex surface (adhering projections)formed on the adhesion surface of copper foil, which penetrated the resin-impregnated inorganic continuously porous sintered body.

*11: Concave-convex degree of hole wall surface: unit μm

A hole was made with a 3 mmφ drill (supplied by Union Tool K.K., used for PWB), and the hole wall was electroless-plated with copper and electro-plated with copper to form a 20μm thick plating. Then, the plating was sealed with a resin and cut, and a photograph of a cut surface was taken, on the basis of which the measurement was made.

*12: Heat resistance: A 5 cm by 5 cm test piece having a copper foil portion having a diameter of 25 mmφ left in the center was placed in a hot air dryer at 350° C. for 30 minutes, and then taken out. The test piece was observed for a surface appearance of the substrate and swelling of the copper foil. The deterioration of the copper foil caused by oxidation was disregarded.

TABLE 1

Physical properties of composite ceramic portion

|  | Unit | Ex. 1 | Ex. 2 | Ex. 3 |
|---|---|---|---|---|
| Bulk density*1 | g/cm³ | 2.73 | 2.72 | 2.51 |
| Water absorptivity*2 | wt % | 0.1 | 0.1 | 0.1 |
| Flexural strength | MPa | 181 | 177 | 141 |
| Dielectric constant*3 |  | 6.5 | 6.5 | 5.1 |
| Dielectric loss tangent*3 |  | 0.0024 | 0.0023 | 0.0058 |
| Thermal expansion coefficient*4 | ×10⁻⁶K⁻¹ | 5.2 | 5.2 | 8.3 |
| Thermal conductivity*5 | W(mK)⁻¹ | 71.2 | 71.1 | 3.2 |
| Chemical resistance*6 | mg/cm² |  |  |  |
| 10% HCl |  | 0.0 | 0.0 | 0.0 |
| 10% NaOH |  | 0.2 | 0.2 | 0.1 |

|  | Unit | Ex. 4 | Ex. 5 | Ex. 6 |
|---|---|---|---|---|
| Bulk density*1 | g/cm³ | 2.53 | 2.36 | 2.50 |
| Water asborptivity*2 | wt % | 0.1 | 0.2 | 0.3 |
| Flexural strength | MPa | 142 | 106 | 135 |
| Dielectric constant*3 |  | 5.2 | 4.9 | 5.8 |
| Dielectric loss tangent |  | 0.0059 | 0.0021 | 0.0118 |
| Thermal expansion coefficient*4 | ×10⁻⁶K⁻¹ | 8.3 | 6.8 | 9.7 |
| Thermal conductivity*5 | W(mK)⁻¹ | 3.2 | 1.3 | 3.2 |
| Chemical resistance*6 | mg/cm² |  |  |  |
| 10% HCl |  | 0.0 | 0.0 | 0.0 |
| 10% NaOH |  | 0.2 | 0.2 | 0.4 |

Ex. = Example

TABLE 2

Inorganic continuously porous sintered body

|  | Ex. 1, 2 | Ex. 3, 4, 6 | Ex. 5 |
|---|---|---|---|
| Inorganic continuous porous sintered body | AN | WC | SP |
| Board thickness (mm) | 0.635 | 1.0 | 3.0 |
| Thickness accuracy (difference) *7 (μm) | ±8 | ±21 | ±29 |
| Average surface roughness*8 |  |  |  |
| ($R_z$) Vertical | 7 | 20 | 26 |
| Lateral | 10 | 23 | 27 |

Ex. = Example

TABLE 3

Physical properties as copper-clad board

|  |  | Ex. 1 | Ex. 2 | Ex. 3 |
|---|---|---|---|---|
| Thickness accuracy (difference)*7 (μm) |  | ±6 | ±8 | ±19 |
| Average surface roughness*8 ($R_z$) Vertical |  | 1.12 | 1.24 | 2.59 |
| Lateral |  | 1.31 | 1.38 | 2.76 |
| Copper foil peel strength*9 | A | 1.6 | 1.15 | 2.1 |
|  | B | 1.7 | 1.8 | 2.2 |
| Adhesive layer*10 |  |  |  |  |
| present (Yes), absent (No) |  | No | No | No |
| Thickness or depth |  | 1.3 | 1.4 | 1.2 |
| Convex-concave degree of hole wall surface*11 |  | 0.3 | 0.3 | 0.6 |
| Heat resistance*12 |  | No failure | No failure | No failure |
| Thickness accuracy (difference)*7 (μm) |  | ±21 | ±28 | ±24 |

TABLE 3-continued

Physical properties as copper-clad board

|  |  | Ex. 1 | Ex. 2 | Ex. 3 |
|---|---|---|---|---|
| Average surface roughness*8 ($R_z$) Vertical |  | 2.63 | 2.91 | 2.71 |
| Lateral |  | 2.84 | 2.95 | 2.83 |
| Copper foil peel strength*9 | A | 2.0 | 1.9 | 1.5 |
|  | B | 2.2 | 2.0 | 1.5 |
| Adhesive layer*10 |  |  |  |  |
| present (Yes), absent (No) |  | No | No | No |
| Thickness or depth |  | 1.3 | 1.4 | 1.2 |
| Convex-concave degree of hole wall surface*11 |  | 0.7 | 0.9 | 1.3 |
| Heat resistance*12 |  | No failure | No failure | No failure |

Ex. = Example

Referential Example 4

The same β-wollastonite sintered body as that used in Example 3 was cut into test pieces having a thickness of 1.6 mm, a length of 80 mm and a width of 25 mm, and the test pieces were washed and dried under heat.

One of the test pieces was impregnated with TMP. This impregnated test piece and the test piece not impregnated were subjected to the following falling ball impact test. Table 4 shows the results.

Falling ball impat test:

A test piece having a length of 80 mm, a width of 25 mm and a predetermined thickness was placed on supports which were placed 35 mm away from each other, and an iron ball having a weight of 55 g was dropped on the central portion between the supports from a predetermined height to determine a smallest height when the test piece underwent cracking, breaking, etc.

TABLE 4

Falling ball impact test (board thickness 1.6 mm, 55 g iron ball

|  | WC1 impregnated with TMP | WC1 not impregnated |
|---|---|---|
| Height | 13 cm | 6 cm |

The test pieces showed the following broken states. That is, WCI impregnated with TMP was broken into two pieces, and WC1 not impregnated was broken into small pieces.

The above results show that the inorganic continuously porous sintered body impregnated with TMP in the present invention has greatly improved impact resistance as compared with the counter part not impregnated, and can be sliced into excellent thin plates.

Example 7

The same aluminum nitride-boron nitride composite material (=AN) as that used in Example 1 was sliced with a multi-blade saw to prepare a sliced sintered body having a size of 2 mm×81 mm×81 mm (to be referred to as "AN3" hereinafter).

A solution of 3 wt % of aluminum tris (ethylacetylacetonate) (trade name: ALCH-TR, supplied by Kawaken Fine Chemical K.K.) in methyl ethyl ketone (to be referred to as "solution OM1-1" hereinafter) was prepared.

AN3 was placed in a container, and the container was placed in a vacuum impregnator. The temperature in the impregnator was increased to 60° C., the pressure was decreased to 7 kPa or less, and then the AN3 was maintained for 1 hour to dry it under vacuum.

The solution OM1-1 was poured into the container with AN3 in it, and the AN3 was maintained for 30 minutes for impregnation under vacuum. Then, the impregnated AN3 was taken out.

The above impregnated AN3 was placed in a dryer, and dried by increasing the temperature stepwise in the manner of 120° C./60 minutes +180° C./30 minutes +250° C./30 minutes.

Further, the dry AN3 was taken out and placed on an aluminum plate. Then, the AN3 was placed in a muffle furnace, and temperature-increased from 250° C. to 750° C. at a rate of 8° C./minute. The AN3 was maintained at 750° C. for 1 hour, and then cooled to give AN3 having aluminum oxide formed on its surface including its pore surfaces (to be referred to as "AN3-T" hereinafter).

A thermosetting resin composition (to be referred to as "resin R4" hereinafter) was prepared by mixing 64 parts by weight of 2,2-bis(4-cyanotophenyl)propane, 29 parts by weight of a xylene-formaldehyde resin-modified novolak-epoxy resin (epoxy equivalent 259, softening point 83° C., number average molecular weight 1,163, trade name; Denacal, supplied by Nagase Chemical Co., Ltd.), 3.0 parts by weight of a polybutadiene-modified epoxy resin (number average molecular weight 1,800, density 0.95–0.97 g/cm$^2$, epoxy addition amount 7.3 mol/molecule, trade name: Nisseki Polybutadiene E-1800-6.5, supplied by Nippon Petrochemical Co., Ltd.), 3.0 parts by weight of γ-glydidoxypropyltrimethoxysilane, 0.9 part by weight of bis(4-maleimidephenyl)methane and 0.1 part by weight of an imidazole-containing catalyst (trade name; C11Z-CN, supplied by Shikoku Chemical Co., Ltd.).

The above-obtained AN3-T was placed in an impregnation container, and the container was placed in a pressure-reducible impregnator. The pressure in the system was decreased to 0.66 kPa or lower, the temperature was increased to 110° C., and the AN3-T was maintained at this temperature for 1 hour.

Further, the above-prepared resin R4 was placed in a resin container of the pressure-reducible impregnator, melted at 110° C., and degassing-treated under vacuum for 10 minutes.

While the decreased pressure was maintained, the above resin R4 was gradually introduced into the impregnation container through the bottom of the container at 110° C., and the impregnation was carried out under vacuum for 30 minutes.

AN3-T impregnated with the resin R4 was taken out of the pressure-reducible impregnator, the resin on the surface was removed by dropping it. The resin R4 was also solidified by cooling it to give a resin-impregnated AN3-T (to be referred to as "R-AN3" hereinafter).

A 31 μm thick low-profile electrolytic copper foil (supplied by Furukawa Circuit Foil K.K., VLP foil, elongation ratio (at 180° C.) vertical 9.0%, lateral 8.4%) was placed on each of the surfaces of the above R-AN3-T, and the resultant laminate was sandwiched with aluminum plates. The so-prepared placed was set between hot pressing plates, and the pressure reduction was initiated. The hot pressing plates was heated, and when the temperature of R-AN3-T reached 120° C., the exerting of the pressure was initiated. The plane pressure was set at 1.5 MPa, and this pressure was maintained. When the temperature reached 140° C., the pressure reduction was terminated, and the pressure was opened to atmosphere. The R-AN3-T was maintained at 140° C. for 15 minutes. Then, the R-AN3-T was temperature-increased up to 190° C., press-formed for 2 hours, and self-cooled to give a copper-clad composite aluminum nitride board. The time from the initiation of the pressure reduction to the exerting of the pressure was 30 minutes long, and the time until the termination of the pressure reduction was 10 minutes long.

The above-obtained copper-clad composite aluminum nitride board was measured for physical properties, and Table 5 shows the results.

Comparative Example 1

A copper-clad composite aluminum nitride board was obtained in the same manner as in Example 7 except that AN3 was directly impregnated with the resin R4 under vacuum instead of impregnating AN3-T.

The above-obtained copper-clad composite aluminum nitride board was measured for physical properties, and Table 5 shows the results.

Comparative Example 2

A copper-clad composite aluminum nitride board was obtained in the same manner as in Example 7 except that there was used AN3-CT which was obtained by impregnating AN3 with the solution OM1-1, placing it in a dryer and drying it stepwise in the manner of 120° C./60 minutes +180° C./30 minutes +250° C./30 minutes without carrying out the pyrolysis in a muffle furnace.

The above-obtained copper-clad composite aluminum nitride board was measured for physical properties, and Table 5 shows the results.

Comparative Example 3

A copper-clad composite aluminum nitride board was obtained in the same manner as in Comparative Example 2 except that there was used AN3-ST which was obtained by treating AN3-CT with steam at 98° C. for 1 hour, and drying it stepwise in the same as in Comparative Example 2.

The above-obtained copper-clad composite aluminum nitride board was measured for physical properties, and Table 5 shows the results.

Example 8

A copper-clad composite aluminum nitride board was obtained in the same manner as in Example 7 except that the 31 μm thick low-profile electrolytic copper foil was replaced with a 18 μm thick, general profile-treated electrolytic copper foil.

Example 9

A solution of 3 wt % of aluminum tris (acetylacetonate) (trade name: Almikylate A, supplied by Kawaken Fine Chemical K.K.) in methyl ethyl ketone (to be referred to as "solution OM1-2" hereinafter) was prepared.

Impregnated AN3 was obtained in the same manner as in Example 7 except that the above solution OM1-2 was used instead.

The above impregnated AN3 was placed in a dryer and dried by temperature-increasing it stepwise in the manner of 120° C./30 minutes +160° C./30 minutes +180° C./30 minutes +230° C./30 minutes +250° C./30 minutes.

The above-obtained dry AN3 was heat-treated in a muffle furnace in the same manner as in Example 7, and cooled to give AN3 having aluminum oxide formed on its surface including its pore surfaces (to be referred to as "AN3-T2" hereinafter).

A copper-clad composite aluminum nitride board was obtained in the same manner as in Example 7 except that the above-obtained AN3-T2 and a 31 μm thick low-profile copper foil (supplied by Furukawa Circuit Foil K.K., LP foil, elongation ratio (at 180° C.) vertical 4.7%, lateral 4.1%) were used instead.

The above-obtained copper-clad composite aluminum nitride board was measured for physical properties, and Table 5 shows the results.

Example 10

A solution of 3 wt % of (2-n-butoxycarbonylbenzoyloxy) tributoxytitanium (trade name: Titacoat S-181, supplied by Kawaken Fine Chemical K.K.) in toluene (to be referred to as "Solution OM1-3" hereinafter) was prepared.

Impregnated AN3 was obtained in the same manner as in Example 7 except that the above solution OM1-3 was used instead.

The above impregnated AN3 was placed in a dryer and dried by temperature-increasing it stepwise in the manner of 120° C./30 minutes +160° C./30 minutes +180° C./30 minutes +230° C./30 minutes +250° C./30 minutes.

The above-obtained dry AN3 was heat-treated in a muffle furnace in the same manner as in Example 7, and cooled to give AN3 having titanium oxide formed on its surface including its pore surfaces (to be referred to as "AN3-T3" hereinafter).

A copper-clad composite aluminum nitride board was obtained in the same manner as in Example 9 except that the above-obtained AN3-T3 was used instead.

The above-obtained copper-clad composite aluminum nitride board was measured for physical properties, and Table 5 shows the results.

Example 11

A thermosetting resin composition (to be referred to as "resin R5" hereinafter) was prepared by mixing 28.1 parts by weight of a bisphenol A type epoxy resin (trade name; Epikote 828, supplied by Yuka-Shell Epoxy K.K.), 29 parts by weight of the same xylene-formaldehyde resin-modified novolak-epoxy resin (Denacal T, supplied by Nagase Chemical Co., Ltd.) as that used in Example 7, 45.1 parts by weight of methyl hexahydrophthalic acid anhydride, 1.6 parts by weight of γ-glycidoxypropyltrimethoxysilane and 0.2 part by weight of triethanolamine.

A copper-clad composite aluminum nitride board was obtained in the same manner as in Example 9 except that the above resin R5 was used instead.

The copper-clad composite aluminum nitride board was measured for physical properties, and Table 5 shows the results.

TABLE 5

| | | Ex.7 | CEx.1 | CEx.2 | CEx.3 |
|---|---|---|---|---|---|
| Dielectric constant*3 | | 6.6 | 6.5 | 6.5 | 6.7 |
| Dielectric tangent*3 | ×10⁻⁴ | 22 | 24 | 23 | 31 |
| Thickness accuracy*7 | | ±6 | ±6 | ±6 | ±6 |
| Average surface | Vert. | 2.92 | 2.94 | 2.93 | 3.01 |
| roughness (R_z) | Late. | 2.96 | 2.95 | 2.96 | 3.03 |
| Copper foil peel | A | 1.4 | 0.5 | 0.4 | 0.1 |
| strength*9 | S | 1.5 | 0.7 | 0.4 | peeled |
| Adhesive layer, presence (yes) absence (No)*10 | | No | No | No | No |
| Heat resistance *12 | | No | No | No | No |
| Thermal conductivity*5, | W(mK)⁻¹ | | | | |
| Substrat surface | | 71.5 | 71.2 | 69.8 | 65.2 |
| Cu surface | | 67.1 | peeled | peeled | peeled |

| | | Ex.8 | Ex.9 | Ex.10 | Ex.11 |
|---|---|---|---|---|---|
| Dielectric constant*3 | | 6.6 | 6.6 | 6.9 | 7.0 |
| Dielectric tangent*3 | ×10⁻⁴ | 22 | 23 | 25 | 62 |
| Thickness accuracy*7 | | ±6 | ±6 | ±6 | ±6 |
| Average surface | Vert. | 3.20 | 2.91 | 2.92 | 2.98 |
| roughness (R_z) | Late. | 3.40 | 2.97 | 2.97 | 3.02 |
| Copper foil peel | A | 1.8 | 1.8 | 1.8 | 1.5 |
| strength*9 | S | 1.8 | 1.9 | 1.8 | 1.5 |
| Adhesive layer, presence (yes) absence (No)*10 | | No | No | No | No |
| Heat resistance *12 | | No | No | No | No |
| Thermal conductivity*5, | W(mK)⁻¹ | | | | |
| Substrat surface | | 71.2 | 71.4 | 71.5 | 71.5 |
| Cu surface | | 66.7 | 67.0 | 66.9 | 66.7 |

Notes)
Ex. = Example, CEx. = Comparative Example See notes (explanations) to Tables 1 to 3 for the above properties.

Example 12

A metal alkoxide solution (to be referred to as "solution OM2-1" hereinafter) was prepared by mixing 80wt % of tetra-n-butoxytitanium (trade name; TBT, supplied by Mitsubishi Gas Chemical Co., Inc.) and 20 wt % of isopropyl alcohol (to be referred to as "IPA" hereinafter).

As an inorganic continuously porous sintered body, a 5.0 mm thick, 300 mm×300 mm, β-wollastonite porous material (trade name: Machinax, supplied by Mitsui Mining Material Co., Ltd., bulk density 1.9, true porosity 33%, open porosity 28%, average pore radius 1.8 μm, to be referred to as "WC3" hereinafter) was prepared.

WC3 was placed in a container, and the container with wC3 in it was placed in a vacuum dryer. The pressure in the vacuum dryer was decreased to 7 kPa or lower, the temperature was increased to 60° C., and the WC3 was maintained at this temperature for 1 hour for treatment under vacuum.

While the decreased pressure was maintained, the solution OM2-1 was poured into the container and maintained for 1 hour to impregnate WC3 with it, and the impregnated WC3 was taken out.

The above impregnated WC3 was placed on a stainless steel plate, the plate with the WC3 on it was placed in a steam container, and the WC3 was treated with steam at 98° C. for 1 hour. Then, the WC3 was placed in a dryer and temperature-increased from room temperature to 30°0 C. at a rate of 3° C./minute. The WC3 was taken out and placed on an aluminum plate. The plate with the WC3 on it was placed in a muffle furnace, temperature-increased from 300° C. to 750° C. over 1 hour, maintained at 750° C. for 1 hour, and cooled. The surface of the WC3 was polished to remove superfluous titanium oxide adhering to the surface and to improve its thickness accuracy, whereby an inorganic continuously porous sintered body having titanium oxide deposited in its pores (to be referred to as "WC3-M" hereinafter) was obtained.

A thermosetting resin composition (to be referred to as "resin R5" hereinafter) was prepared by mixing 87 wt % of a cyanate-maleimide resin (trade name: BT-2100, 2,2-bis(4-cyanatophenyl)propane/bis(4-meleimidephenyl)methane=9/1), 10wt % of a bisphenol A type resin (trade name: Epikote 152, epoxy equivalent 172–179, supplied by Yuka-Shell Epoxy K.K.) and 3 wt % of γ-glycidoxypropyltrimethoxysilane.

WC3-M impregnated with the resin R5 (to be referred to as "R-WC3-M" hereinafter) was obtained in the same manner as in Example 1 except that the above-prepared WC3-M and the resin R5 were used instead.

A 18 μm thick low-profile copper foil (supplied by Furukawa Circuit K.K., VLP foil, elongation ratio (at 180° C.) vertical 12.8%, lateral 7.7%) was placed on each of the surfaces of the above R-WC3-M. Cut cardboard pieces were prepared from a 6 mm thick cardboard, and a paper tape was attached to the inner margin of each piece. These cardboard pieces were placed around the R-WC3-M, and the R-WC3-M was lamination-press-formed to give a 5 mm thick copper-clad composite ceramic board having an insulation layer having an increased dielectric constant.

The above copper-clad composite ceramic board was measured for dielectric characteristic, etc., and Table 6 shows the results.

Table 6 also shows the results of measurement of a board obtained in the same manner as above except that the treatment of impregnation and precipitation with/of the organometal compound (OM2-1) according to the present invention was not carried out (Referential Example 12).

Example 13

A metal alkoxide solution (to be referred to as "solution OM2-2" hereinafter) was prepared by mixing 80 wt % of tetra-isopropoxytitanium (trade name; TPT, supplied by Mitsubishi Gas Chemical Co., Inc.) and 20 wt % of methyl alcohol (to be referred to as "MeOH" hereinafter).

A copper-clad composite ceramic board was obtained in the same manner as in Example 12 except that the above solution OM2-2 was used instead of the solution OM2-1 and that the impregnation temperature was changed to 20° C.

The above board was measured for physical properties, and Table 6 shows the results.

Example 14

A metal alkoxide solution (to be referred to as "0M2-3" hereinafter) was prepared by mixing 75 wt % of di-isopropoxy-bis(acetylacetonato)titanium (trade name; TAA, supplied by Mitsubishi Gas Chemical Co., Inc.) and 25 wt % of isopropyl alcohol.

As an inorganic continuously porous sintered body, a 5.0 mm×60 mm×60 mm aluminum nitride-boron nitride porous material (h-BN content 12%, bulk density 2.45, true porosity 20.6%, average pore radius 0.66 μm, to be referred to as "AN4" hereinafter).

A 5.0 mm thick excellent board was obtained in the same manner as in Example 12 except that the solution OM2-1 was replaced with the solution OM2-3, that WC3 was replaced with AN4, that the temperature for the impregnation of the organometal compound was changed to 20° C. and that the temperature for the steam treatment was changed to 60° C.

The above board was measured for physical properties, and Table 6 shows the results.

Table 6 also shows the results of measurement of a board obtained in the same manner as above except that the treatment of impregnation and precipitation with/of the organometal compound (OM2-3) according to the present invention was not carried out (Referential Example 14).

Example 15

As an inorganic continuously porous sintered body, a 2.0 mm thick, 150 mm×150 mm cordierite porous material (trade name; Lepton 902, supplied by Kikusui Chemical Industry Co., Ltd., specific gravity 1.5, true porosity 45%, water absorptivity 23%, (open porosity 44.8%), to be referred to as "CR1" hereinafter) was prepared.

A 2 mm thick excellent board was obtained in the same manner as in Example 12 except that WC3 was replaced with CR1.

The above board was measured for physical properties, and Table 6 shows the results.

Table 6 also shows the results of measurement of a board obtained in the same manner as above except that the treatment of impregnation and precipitation with/of the organometal compound (OM2-1) according to the present invention was not carried out (Referential Example 15).

Example 16

A thermosetting resin composition (to be referred to as "resin R6" hereinafter) was prepared by mixing 53.1 wt % of a bisphenol A type epoxy resin (trade name; Epikote 828, supplied by Shell Chemical Co., Ltd.), 45.1 wt % of methyl hexahydrophthalic acid anhydride, 1.6 wt % of γ-glycidoxypropyltrimethoxysilane and 0.2 wt % of triethanolamine.

A 2 mm thick excellent board was obtained in the same manner as in Example 15 except that the resin R5 was replaced with the above resin R6. The board was measured for physical properties, and Table 6 shows the results.

Table 6 also shows the results of measurement of a board obtained in the same manner as above except that the treatment of impregnation and precipitation with/of the organometal compound according to the present invention was not carried out (Referential Example 16).

Example 17

As an inorganic continuously porous sintered body, a 1.0 mm thick, 150 mm×150 mm silica porous material (trade name; P-type, supplied by Clayburn K.K., bulk density 1.9, true porosity 36%, open porosity 21%, composition $SiO_2$/$CaO$/$Al_2O_3$=65/25/10, to be referred to as "SP1" hereinafter) was prepared.

A 1 mm thick excellent board was obtained in the same manner as in Example 12 except that the WC3 was replaced with the above SP1. The board was measured for physical properties, and Table 6 shows the results.

Table 6 also shows the results of measurement of a board obtained in the same manner as above except that the treatment of impregnation and precipitation with/of the organometal compound according to the present invention was not carried out (Referential Example 17).

TABLE 6-1

|  | Unit | Ex. 12 WC3 | Ex. 13 WC3 | REx. 12 WC3 |
| --- | --- | --- | --- | --- |
| Bulk density*1 | g/cm³ | 2.44 | 2.41 | 2.31 |
| Water absorptivity*2 | % | 0.06 | 0.06 | 0.06 |
| Flexural strength | MPa | 132 | 134 | 140 |
| Dielectric constant*3 |  | 38 | 29 | 5.4 |
| Dielectric tangent | ×10⁻⁴ | 258 | 126 | 38 |
| Thermal expansion coefficient*4 | 10⁻⁶K⁻¹ | 8.9 | 9.5 | 10.0 |
| Thermal conductivity*5 | W(mK)⁻¹ | 2.2 | 2.0 | 1.9 |
| Chemical resistance*6 | 10% HCl | 0.7 | 0.7 | 0.8 |
|  | 10% NaOH | +0.8 | +0.9 | +1.1 |

|  | Unit | Ex. 14 AN4 | REx. 14 AN4 |
| --- | --- | --- | --- |
| Bulk density*1 | g/cm³ | 2.81 | 2.73 |
| Water absorptivity*2 | % | 0.06 | 0.05 |
| Flexural strength | MPa | 161 | 170 |
| Dielectric constant*3 |  | 12 | 6.3 |
| Dielectric tangent | ×10⁻⁴ | 68 | 12 |
| Thermal expansion coefficient*4 | 10⁻⁶K⁻¹ | 5.2 | 5.1 |
| Thermal conductivity*5 | W(mK)⁻¹ | 72 | 71 |
| Chemical resistance*6 | 10% HCl | +0.2 | +0.3 |
|  | 10% NaOH | +0.3 | +0.5 |

Ex. = Example, REx. = Referential Example

TABLE 6-2

|  | Unit | Ex. 15 CR1 | REx. 15 CR1 | Ex. 16 CR1 |
| --- | --- | --- | --- | --- |
| Bulk density*1 | g/cm³ | 1.94 | 1.75 | 1.98 |
| Water absorptivity*2 | % | 0.05 | 0.04 | 0.12 |
| Flexural strength | MPa | 52 | 57 | 51 |
| Dielectric constant*3 |  | 41 | 4.6 | 39 |
| Dielectric tangent | ×10⁻⁴ | 126 | 64 | 268 |
| Thermal expansion coefficient*4 | 10⁻⁶K⁻¹ | 5.1 | 5.5 | 5.3 |
| Thermal conductivity*5 | W(mK)⁻¹ | 0.9 | 0.6 | 0.9 |
| Chemical resistance*6 | 10% HCl | +0.1 | +0.1 | +0.1 |
|  | 10% NaOH | +0.2 | +0.3 | +0.3 |

|  | Unit | REx. 16 CR1 | Ex. 17 SP1 | REx. 17 SP1 |
| --- | --- | --- | --- | --- |
| Bulk density*1 | g/cm³ | 1.78 | 2.11 | 2.01 |
| Water absorptivity*2 | % | 0.10 | 0.07 | 0.08 |
| Flexural strength | MPa | 53 | 46 | 48 |
| Dielectric constant*3 |  | 4.15 | 16 | 5.1 |
| Dielectric tangent | ×10⁻⁴ | 172 | 71 | 17 |
| Thermal expansion coefficient*4 | 10⁻⁶K⁻¹ | 5.8 | 6.3 | 6.5 |
| Thermal conductivity*5 | W(mK)⁻¹ | 0.7 | 0.7 | 0.5 |
| Chemical resistance*6 | 10% HCl | +0.1 | 0.5 | 0.7 |
|  | 10% NaOH | +0.6 | +0.8 | +1.0 |

Ex. = Example, REx. = Referential Example

Example 18

A thin sheet of a resin-impregnated wollastonite porous material (to be referred to as "R4-WC1" hereinafter) was obtained from the same 1 mm thick WC1 as that used in Example 3 and the same resin R4 as that used in Example 7 in the same manner as in Example 1.

A 18 μm thick low-profile electrolytic copper foil (VLP foil) was placed on each of the surfaces of the above-obtained R4-WC1, and the resultant laminate was press-formed to give a dual-side copper-clad β-wollastonite board (to be referred to as "C-R4-WC1" hereinafter).

In the above press-forming, the pressure reduction and the temperature increase were initiated when the press-forming is initiated. When the temperature of the laminate reached 120° C., the exerting of the pressure was initiated up to 1.5 MPa. Then, when the temperature reached 140° C., the pressure reduction was terminated, and pressure was opened to atmosphere. While the pressure of 1.5 MPa was maintained, the press-formed set was maintained for 100 minutes up to a temperature of 190° C. The time required before the initiation of the exerting of the pressure was 10 minutes long, and the time required before the termination of the pressure reduction was 15 minutes long.

The above C-R4-WC1 was provided with a model printed wiring network for an internal layer on both surfaces and two guide holes, to give a substrate PCI-WC-1.

On the other hand, the same R4-WC1 boards as that obtained above were also provided with two guide holes to give substrates PI-WC-1.

One substrate PI-WC-1 was placed on one surface of the PCI-WC-1 with registering with the guide holes, and the other substrate PI-WC-1 was also placed on the other surface of the PCI-WC-1 with registering with the guide holes. Further, a 18 μm thick low-profile electrolytic copper foil (VLP foil) was placed on each PI-WC-1, and the resultant set was laminate-formed to give an about 3 mm thick dual-side copper-clad four-layered board having an excellent appearance.

The above-obtained multi-layered board was tested for physical properties, and Table 7 shows the results.

Example 19

The same C-R4-WC1 boards as that obtained in Example 18 were provided with a model printed wiring network for an internal layer on one surface each and two guide holes, to give two substrates PCI-WC-2.

On the other hand, the same R4-WC1 as that obtained in Example 18 was also provided with two guide holes to give a substrate PI-WC-2.

One substrate PCI-WC-2 was placed on one surface of the substrate PI-WC-2 with registering with the guide holes such that the pattern side of the PCI-WC-2 was attached, and the other substrate PCI-WC-2 was placed on the other surface in the same manner as above, and the resultant set was multi-layer-laminate-formed to give an about 3 mm thick dual-side copper-clad four-layered board having an excellent appearance.

The above multi-layered board was tested for physical properties, and Table 7 shows the results.

Example 20

A 8×8×2.5 (cm) block of an aluminum nitride-boron nitride porous sintered body (BN content 12.5%, bulk density 2.45, open porosity 20.6%, average pore radius 0.6μm) was placed in an impregnation container of a pressure-reducible impregnator, and the pressure was reduced to 7 KPa. Then, the temperature was increased to 110° C., and the block was dried under reduced pressure for 2 hours. On the other hand, a resin composition of 2,2-bis(4-cyanatophenyl)propane/bis(maleimidephenyl)methane=9/1 (weight ratio) was placed in a resin container of the pressure-reducible impregnator, and the pressure was reduced to 0.7 KPa. The container temperature was set at 110° C. to melt and degas the composition.

Then, the molten resin was poured into the impregnation container at 110° C. to carry out the impregnation under vacuum for 30 minutes. The aluminum nitride-boron nitride sintered body was taken out of the impregnation container, wrapped with a Teflon-coated aluminum foil and temperature-increased stepwise in the manner of 120° C./30 minutes +150° C./30 minutes +180° C./30 minutes +190° C./2 hours to cure the resin.

The resultant block was sliced with a diamond cutter (diamond tool #200, supplied by Nippon Diamond K.K.) to give a rein-impregnated aluminum nitride porous sintered body boards having a size of 8 cm×8 cm and a thickness of 0.635 min.

Two boards taken from the above-obtained boards were provided with guide holes (substrates I-BR). Further, other board was provided with guide holes and each surface thereof was provided with mirror pattern grooves for internal layer printed wiring by machine processing (one substrate II-1R). Further, other two boards were provided with guide holes and one surface of each board was provided with mirror pattern grooves for internal layer printed wiring by machine processing(two substrates II-2BR).

The above-processed boards were placed on an aluminum plate, temperature-increased to 750° C. over 30 minutes, and maintained at 750° C. for 2 hours to completely remove the resin by pyrolysis.

The resultant aluminum nitride sintered body boards from which the resin was removed by pyrolysis above were surface-treated for adhesion under the same conditions as those in Example 7, to give substrates having aluminum oxide formed in their pore surfaces.

The above-prepared substrates were placed in an impregnation container of a pressure-reducible impregnator, the pressure was reduced to 0.7 KPa, the temperature was increased to 110° C., and the substrates were dried under vacuum.

On the other hand, the same resin R4 as that prepared in Example 7 was placed in a resin container of the pressure-reducible impregnator, the pressure was reduced to 0.7 kPa, and the temperature of the container was set at 110° C. to melt and degas the resin.

Then, the resin R4 was introduced into the impregnation container at 110° C., and the impregnation was carried out under vacuum for 30 minutes. The resin-impregnated substrates were taken out of the container, and cooled by inserting polyethylene tubes through the guide holes of each substrate, to give resin-impregnated aluminum nitride sintered body boards of which the resin was solidified (to be referred to as "substrate PI-1RT, substrates PI-2RT or substrates I-RT" hereinafter).

A 18 μm thick low-profile electrolytic copper foil (VLP foil) was placed on each of the surfaces of each of the above-obtained substrates I-RT, and the resultant set was press-formed to give dual-side copper-clad ceramic boards.

Each of the above dual-side copper-clad ceramic boards were provided with a model printed wiring network on the basis of the guide holes, to give two internal layer boards (to be referred to as "substrates PCI-A" hereinafter).

The above two substrates PCI-A, the substrate PI-1RT and the two substrates PI-2RT were stacked with registering with the guide holes such that the substrate PI-1RT was placed between the two substrates PCI-A and that the two substrates PI-2RT were placed one on one outer surface and the other on the other outer surface. Further, a 18 μm thick low-profile electrolytic copper foil (VLP foil) was placed on each of the external surfaces. The resultant set was laminate-press-formed to give an about 3.2 mm thick dual-side copper-clad eight-layered board having an excellent appearance.

The above multi-layered board was tested for physical properties, and Table 7 shows the results.

TABLE 7

|  | Ex. 18 | Ex. 19 | Ex. 20 |
| --- | --- | --- | --- |
| Substrate material | wollastonite | wollasatonite | aluminum nitride |
| Layer constitution | II/I/II | I/II/I | II/I/II/I/II |
| Peel strength of outer layer copper foil (kg/cm)*13 | | | |
| Initial | 0.9–1.2 | 1.1–1.2 | 1.2–1.3 |
| After heat-cycle test*14 | 0.8–1.1 | 1.1–1.2 | 1.2–1.3 |
| After heat-cycle test | | | |
| Appearance | No failure | No failure | No failure |
| Adhesion strength of internal layer*15 | Unmeasurable | Unmeasurable | Unmeasurable |

Ex. = Example

Notes to Table 7 (physical properties, etc.) are as follows:
*13: Copper foil supplied by Furukawa Circuit Foil; VLP foil, elongation ratio (at 180° C.) Vertical 12.8%, Lateral 7.7%, Profile-treated surface $R_z$=5.1 μm, Ra=0.8 μm.
*14: Heat cycle test conditions: one cycle consisting of 150° C./30 minutes→left to stand for 15 minutes→60° C./30 minutes→left to stand for 15 minutes; This cycle was repeated 100 times.
*15: Adhesion strength of internal layer: Unmeasurable means that interlayer peeling was attempted, but the layers were not peeled and were broken.

Example 21

(Process using laminate press-forming frame)

As an inorganic continuously porous sintered body, pieces of a 35 mm thick, 340 mm×340 mm β-wollastonite porous material (bulk density 2.1, true porosity 27.6%, open porosity 18.5%, average pore radius 3.4 μm, trade name: Machinax, supplied by Mitsui Mining Material Co., Ltd.) were cut 5 mm in four corners each and used. The above pieces of the porous material were impregnated with TMP in an impregnation container having a larger size, taken out, and cooled to room temperature, in the same manner as in Example 1.

Superfluous TMP adhering to their surfaces was removed, and the pieces were bonded together with an adhesive to obtain a corners-removed 105 mm thick, 340 mm×340 mm block.

The above block was set in a multi-blade saw (blade D 0.4 mm, L 750 mm, using #600 cutting oil), and sliced to 1.6 mm thick excellent thin boards of which the four corners were removed.

The above thin boards were washed with a methanol/methyl ethyl ketone (60/40) mixed solution to remove the cutting oil and a most part of TMP. Then, the thin boards were treated at 80° C. for 30 minutes, then temperature-increased, and treated at a final temperature of 320° C. for 2 hours to give TMP-removed sliced sintered bodies (to be referred to as "WC5" hereinafter).

Resin-impregnated porous materials (to be referred to as "R4-WC5" hereinafter) were obtained from the above WC5 and the same resin R4 as that used in Example 7 in the same manner as in Example 7.

For removing superfluous resin, R4-WC5 were taken out of the impregnator and the resin was removed by dropping it. Further, the resin 4 was cooled to solidness.

For laminate-press-forming, the following tools were prepared.

Laminate-press-forming frame (die):

A lower frame (die) member was prepared by fixing two registering pins of a bending type for laminate materials on each side of a 450 mm×450 mm aluminum alloy plate such that the one pin was positioned 390 mm distant from a facing side edge and that the other pin was positioned 365 mm distant from the facing side edge (total 8 pins) and fixing two toolings for fixing the lower frame member and an upper flame member outside the pins on each side (total 8 toolings), and an upper frame (die) member was prepared by fixing 8 fixing toolings (total 8 toolings) in corresponding positions on an upper flame-forming plate.

Reverse cushion (paper frame):

A frame having the form of a picture frame was prepared from a 1.7 mm thick reclaimed cardboard. In the frame, two edges had a width of about 2.5 mm and the other two edges had a width of about 1.5 mm. The inner circumference had a size of 340 mm×335 mm plus 0.5 mm or less. A 5 mm wide paper tape was attached to the inner circumference surface. No paper tape was attached to four corners.

Heat-resistant cushion:

Three 0.8 μm thick carbon fiber unwoven fabrics were stacked, and a paper tape was attached to the stack circumference. The stack was sandwiched with two 0.4 mm thick aluminum alloy plates to obtain a cushion.

Metal foil: A 390 mm×360 mm aluminum core dual-side copper foil prepared by temporarily attaching a low-profile copper foil on each of the surfaces of a 0.4 mm thick aluminum alloy plate (18μm thick VLP copper foil, 0.38 mm thick aluminum alloy).

A constitution of heat-resistant cushion/1.6 mm thick iron plate/CAC foil/paper frame/R4-WC5 within the frame/CAC foil/ . . . /paper frame/R4-WC5 in the paper frame/CAC foil/1.6 mm thick iron plate/heat-resistant cushion was formed on the lower frame member while registering them with the registering pins, such that 10 boards were obtained. Then, the upper frame member was placed, and the resultant laminate was temporarily fixed with the fixing toolings.

Thermocouples were connected to end portions of the porous materials R4-WC5 in upper, lower and middle positions.

The above laminate was set between hot pressing plates of a vacuum pressing machine through heat-resistant polyamide felt (thickness 3 mm, felt of Conex (supplied by du Pont de Nemours & Co., Ltd.), supplied by Tokyo Felt K.K.), and the heating of the hot pressing plates and the pressure reduction were initiated.

When the temperature reached 120° C., a pressure of 0.6 MPa was exerted. When the temperature reached 140° C., the pressure reduction was terminated, and a pressure of 1 MPa was exerted. In this state, the temperature was increased up to 190° C., and the laminate was press-formed for 120 minutes. The pressure was released, and the laminate was self-cooled. The ambient pressure when the exerting of pressure was initiated was 0.66 kPa, the time from the initiation of the pressure reduction to the exerting of the pressure of 0.6 MPa was 30 minutes long, and the time until the termination of the pressure reduction was 10 minutes long.

All of the so-obtained copper-clad ceramic boards were free of cracking, and the appearance of each copper foil was excellent.

Example 22

(Process of multiple substrates)

An aluminum nitride-boron nitride composite material (AN) was sliced with a multi-blade saw to obtain 1 mm×81 mm×81 mm boards (to be referred to as "AN4" hereinafter), and these boards were surface-treated for adhesion in the same manner as in Example 7.

Resin-impregnated porous materials (to be referred to as "R4-AN4" hereinafter) were obtained from AN4 and the same resin R4 as that used in Example 7 in the same manner as in Example 7.

For laminate-press-forming, a reverse cushion of a 1.1 mm thick reclaimed cardboard was used. The cardboard was provided with 3×3 frames each of which had an inner circumference having a size of 81 mm×81 mm plus 0.5 mm or less, and a 5 mm wide paper tape was attached to each inner circumference surface. In view of a paper-made direction, the distance between one frame to its adjacent frame was 3 cm in the machine direction, and that in the transverse direction was 1.0 cm.

A constitution of heat-resistant cushion/1.6 mm thick iron plate/CAC foil/paper frame/R4-AN5 within the frame/CAC foil/ . . . /paper frame/R4-AN4 in the paper frame/CAC foil/1.6 mm thick iron plate/heat-resistant cushion was formed on the lower frame member while registering them with the registering pins, such that 5 boards were obtained per frame (45 boards). Then, the upper frame member was placed, and the resultant laminate was temporarily fixed with the fixing toolings.

Thermocouples were connected to end portions of the porous materials R4-AN4 in upper, lower and middle positions.

Copper-clad ceramic boards were obtained in the same manner as in Example 21 except that the above-constituted laminates were used instead.

All of the so-obtained copper-clad ceramic boards were free of cracking, and the appearance of each copper foil was excellent.

As is clear from the above detailed description of the invention and Examples, the metal-foil-clad composite ceramic board according to the process of the present invention has a constitution in which the metal foil is strongly bonded to the inorganic continuously porous sintered body through the adhesive layer in an amount which is the smallest possible, it exhibits excellent physical properties such as high heat spreading property and a low thermal expansion coefficient, it has higher heat resistance than a resin used for impregnating the inorganic continuously porous sintered body, and in particular, it is free from the distortion caused by heating. Further, it is excellent in thickness accuracy and surface flatness and smoothness, and it is also excellent in processability such as drilling property.

Further, the process of the present invention overcomes the variability of the adhesion strength caused by the kind and production process of an inorganic continuously porous sintered body, by the novel surface treatment for adhesion, it gives metal-foil-clad composite ceramic boards having a high dielectric constant, and it permits the novel production of a multi-layered board. It can therefore permit industrial mass-production of metal-foil-clad composite ceramic boards.

Therefore, the metal-foil-clad composite ceramic board according to the present invention can be used as a substrate for an antenna for high frequency, a part module for high frequency and others and it can be also used as a substrate for directly mounting semiconductor chips. Further, owing to the above novel physical properties, it can be used in a field where excellent physical properties of ceramic are required but the use of ceramic is limited due to difficulty in processing ceramic. Clearly, the present invention therefore has great significance.

What is claimed is:

1. A metal-foil-clad composite ceramic board formed of
    a resin-impregnated sintered substrate (IIR) obtained by impregnating a 0.2 to 10 mm thick sintered substrate (II) portion of an inorganic continuously porous sintered body (I) having a true porosity of 12 to 50% and an open porosity of at least 10%, with a thermosetting resin (R) under vacuum, and
    a metal foil,
    the resin-impregnated sintered substrate (IIR) and the metal foil being stacked and press-formed,
    the stacked metal foil having a 10-point average surface roughness Rz of 10 µm or less,
    the resin-impregnated sintered substrate (IIR) and the metal foil having substantially no adhesive layer therebetween or having an adhesive layer having a thickness of 10 µm or less therebetween.

2. A metal-foil-clad composite ceramic board according to claim 1, wherein the inorganic continuously porous sintered body (I) has an open porosity of 15 to 35%, a closed porosity of 2% or less and an average pore diameter of 0.2 to 6 µm.

3. A metal-foil-clad composite ceramic board according to claim 1, wherein the inorganic continuously porous sintered body (I) has a Shore hardness (HS) of 45 or less, a Vickers hardness (HV) of 300 or less and a flexural strength of at least 50 MPa.

4. A metal-foil-clad composite ceramic board according to claim 1, wherein the sintered substrate (II) is a substrate obtained by surface-treating a sintered substrate from the inorganic continuously porous sintered body (I) produced from a green sheet produced by an extrusion method, and has a size of at least 500 cm², a thickness of 1.0 to 6.0 mm, and a thickness accuracy, per a distance of 2 mm to 50 mm, of within ±30 µm.

5. A metal-foil-clad composite ceramic board according to claim 1, wherein the sintered substrate (II) is a substrate obtained by impregnating an at least 10 mm thick block of the inorganic continuously porous sintered body (I) with a liquid organic substance (OR) under vacuum, slicing the block to obtain a board having a predetermined thickness of 0.2 to 6.0 mm, and removing the organic substance (OR) by extraction, gasification or calcining.

6. A metal-foil-clad composite ceramic board according to claim 5, wherein the sintered substrate (II) has a thickness accuracy of within ±20 µm and a 10-point average surface roughness R, of 30 µm or less, and the metal foil has a 10-point average surface roughness $R_z$ of 5 µm or less.

7. A metal-foil-clad composite ceramic board according to claim 1, wherein the sintered substrate (II) is a substrate having improved affinity with the thermosetting resin (R), obtained by impregnating sintered substrate (II) with an organometal compound (OM1), heat-treating the impregnated sintered substrate (II) at a final maximum heating temperature of 650° to 800° C. to pyrolyze the organometal compound (OM1), thereby forming oxide or composite oxide on the substrate including pore surfaces.

8. A metal-foil-clad composite ceramic board according to claim 7, wherein the organometal compound (OM1) is at least one selected from an organometal compound of aluminum, an organometal compound of titanium and an organometal compound of silicon, and is used in impregnating substrate (II) as a thin solution having an organometal compound concentration of 0.05 to 10% by weight.

9. A metal-foil-clad composite ceramic board according to claim 1, wherein the sintered substrate (II) is a substrate having an elevated dielectric constant, obtained by impregnating sintered substrate (II) with an organometal compound (OM2), steam-treating the sintered substrate (II), heat-treating the steam-treated sintered substrate (II) at a maximum temperature of 650° to 900° C. to pyrolyze the organometal compound (OM2), thereby forming oxide or composite oxide in pores.

10. A metal-foil-clad composite ceramic board according to claim 9, wherein the organometal compound (OM2) is at least one compound selected from an organometal compound of titanium, an organometal compound of tantalum, an organometal compound of aluminum, an organometal compound of zirconium, an organometal compound of barium, an organometal compound of calcium, an organometal compound of strontium, an organometal compound of lead and an organometal compound of magnesium, and is selected to form a pyrolysis product in an amount in the range of from 1 to 20% by weight, in pores.

* * * * *

UNITED STATES PATENT AND TRADEMARK OFFICE
CERTIFICATE OF CORRECTION

PATENT NO. : 5,686,172
DATED : November 11, 1997
INVENTOR(S) : KAZUYUKI OHYA and NORIO SAYAMA It is certified that error appears in the above-identified patent and that said Letters Patent is hereby corrected as shown below:

Column 48, line 7, change "$R$," to read --$R_z$--;

line 17, after "substrate" insert --surface--.

Signed and Sealed this

Thirteenth Day of October 1998

Attest:

BRUCE LEHMAN

Attesting Officer

Commissioner of Patents and Trademarks